(12) United States Patent  
Missiroli

(10) Patent No.: US 8,681,567 B2
(45) Date of Patent: Mar. 25, 2014

(54) VOLTAGE REGULATOR FOR BIASING A NAND MEMORY DEVICE

(76) Inventor: Chiara Missiroli, Concorezzo (IT)

(*) Notice: Subject to any disclaimer, the term of this patent is extended or adjusted under 35 U.S.C. 154(b) by 56 days.

(21) Appl. No.: 13/421,358

(22) Filed: Mar. 15, 2012

(65) Prior Publication Data

US 2013/0242671 A1 Sep. 19, 2013

(51) Int. Cl.
G11C 11/34 (2006.01)

(52) U.S. Cl.
USPC .................. 365/185.25; 365/185.24

(58) Field of Classification Search
USPC ........................ 365/185.25, 185.24
See application file for complete search history.

(56) References Cited

U.S. PATENT DOCUMENTS

2010/0074034 A1* 3/2010 Cazzaniga ............... 365/189.09
2012/0098508 A1* 4/2012 Zhu .............................. 323/272

* cited by examiner

*Primary Examiner* — Michael Tran

(57) ABSTRACT

Disclosed herein is a device that includes an amplifier, a first transistor coupled between the first power supply line and the internal node and including a gate terminal supplied with a bias voltage, a second transistor coupled between the internal node and the second power supply line and including a gate terminal coupled to the output terminal of the amplifier, a third transistor coupled between the first power supply line and the output node and including a gate terminal coupled to the internal node, a divider configured to produce a first discharge path from the output node to the second power supply line to establish the feedback voltage to the amplifier, and a first switch circuit supplied with a first signal and coupled between the output node and the internal node.

20 Claims, 16 Drawing Sheets

VOLTAGE REGULATOR FOR BIASING A NAND MEMORY DEVICE

FIELD OF THE INVENTION

The present disclosure relates to a voltage regulator for biasing a NAND memory device.

The disclosure particularly, but not exclusively, relates to a voltage regulator for biasing a NAND memory device, especially the block selector gate line and/or word line connected to the gate of memory cell.

BACKGROUND OF THE INVENTION

In the last years the memory market has been characterized by an increasing interest in high density devices and technology scaling has become more and more aggressive, both for memory core and circuitry, especially for the flash memory devices. While the technology is continuously improving to reduce the memory size, new solutions are studied to reduce the area of the related analog circuitry, which is not exclusively dependent on technology, but mainly on the specifically adopted layouts and architectures.

FIG. 1 schematically shows an exemplary structure of a memory and a memory controller of a conventional NAND flash memory.

The Flash memory 100, for example, may include page buffer, memory cell array, and configuration/redundancy data. Specific address in the Flash memory 100 can be accessed by using a Row Decoder 122 and the COLUMN Decoder 145. The ROW Decoder 122 and the COLUMN Decoder 145 are controlled by the controller that includes a ROW control system 120, a COLUMN control system 130, and a uC UNIT 140. Thereby, the data stored in the Flash memory 100 can be read to a SRAM matrix. Reversely, the data stored in the SRAM matrix can be written into a location of the Flash memory 100.

In read, write and erase operations, a voltage regulator 160 are used to produce appropriate voltages, and the voltages are supplied to the Flash memory 100.

Flash memory substantially is a non-volatile computer storage chip that can be electrically erased and reprogrammed. Generally, a Flash memory includes a lot of cells, and each cell is made, for example, by floating gate transistor. Each memory cell store the information i.e 1 if erased and 0 if programmed.

In an example when the floating gate transistor is used for each cell of a Flash memory, each memory cell resembles a standard MOSFET, except the transistor has two gates instead of one. On top, there is a control gate as in other MOS transistors, but below this there is a floating gate being insulated all around by an oxide layer. By confining or releasing electron in the floating gate, the Flash memory can thus store information for a long time without loss, due to the structure of the floating gate and control gate, i.e. the insulated floating gate. However, this specific structure for floating gate is mere an example to explain an embodiment of the invention, and does not limit the scope of the invention. Other type of transistor or memory device can be used for memory cell instead of a floating gate transistor.

To erase a cell of a Flash memory, i.e. resetting it to the "1" state, a large voltage of the opposite polarity is applied between the control gate and the source terminals or is applied between the control gate and its substrate-side well, pulling the electrons off the floating gate through quantum tunneling. This erasing operation usually can be performed on a block-wise basis, that is to say, all the cells in an erase sector are erased together.

A single-level flash cell in its default state is logically equivalent to a binary "1" value, because current will flow through the channel under application of an appropriate voltage to the control gate. In a NOR type memory, a flash cell can be programmed, or set to a binary "0" value, by applying an elevated on-voltage to the control gate terminal, causing the flowing of electrons from the source to the drain terminals, assuming an NMOS transistor. If the current between the source and drain terminals is sufficiently high, some high energy electrons could jump through the insulating layer onto the floating gate, via a process called hot-electron injection.

Generally, the program operation can be done on a byte or word basis. Alternatively, for NAND type flash memory, the program operation may be done on a page basis, whereas the erase operation is done on a block basis.

FIG. 2 schematically represents an exemplary cell matrix organization and driving circuitry of NAND memory.

The matrix of the flash memory 100 shown in FIG. 1 may include two planes shown as PLANE0 290 and PLANE 295 in FIG. 2. A PERIPHERAL CIRCUITS 210 shown in FIG. 2 includes the voltage regulator 160, the charge pumps shown in FIG. 1, and the like. A voltage regulator 215 shown in FIG. 2 corresponds to the voltage regulator 160 shown in FIG. 1.

Each of planes 290 and 295 includes a plurality of cells. The left plane of the matrix is named as PLANE0 290, and the right plane of the matrix is named as PLANE1 295. PLANE0 includes a page buffer 225, j number of row drivers 245 and j number of Blocks 240. Each of PLANE0 290, PLANE 295 includes row driver x-y where x represents row and y represents the number of plane. PLANE0 290 includes row driver 0-0, row driver 1-0, row driver 2-0, . . . row driver j-0, i.e. j row drivers. Each row driver corresponds to a block in the same row. A block is the smallest unit of the NAND array that can be erased at once. Row driver 0-0 corresponds to block 0, row driver 1-0 corresponds to block 1, and row driver j-0 corresponds to block j. Each row driver is connected to strings which belong to the corresponding block with at least one word line (unseen in FIG. 2) With regard to the detailed structure of word lines and stacks it will be described later with reference to FIG. 3.

Each of the Blocks 240 includes k number of strings 250, and each string is connected with other strings belonging to different blocks by a bit line of the same column. For example, block 0 includes S0, S1, S2, . . . Sk. Here, S represents the initial letter of "string". Similarly, block 1 includes S0, S1, S2 . . . Sk. The other blocks, e.g. block 2, 3, . . . , block j also includes k number of strings (S0, S1, S2, . . . Sk) as well. All S0 in the blocks are connected to one another through a bit line, i.e. BL0. Here, BL is an abbreviation of bit line. In a similar manner, BL1 is connected to S1 of Block 0, Block 1, Block 2, . . . and Block j. BL k is connected to Sk in each Block 240. A Page buffer circuitry 225 of the PLANE0 290 is connected to the bit lines, such as BL0, BL1, BL2, . . . BLk, a single page buffer driving one or two bitlines.

In a similar way, the PLANE1 295 of the cell matrix is configured. PLANE1 thus includes a page buffer circuitry 230, j number of row drivers 245, j number of Blocks 240. PLANE1 295 includes row driver 0-1, row driver 1-1, row driver 2-1, . . . row driver j-1, i.e. j number of row drivers. Each row driver corresponds to a block. That is to say, row driver 0-1 corresponds to block 0, row driver 1-1 corresponds to block 1, and row driver j-1 corresponds to block j. Each row driver is connected to strings in the corresponding block with at least one word line (unseen in FIG. 2) With regard to the detailed structure of word lines and stacks, it will be described later with reference to FIG. 3.

FIG. 3 schematically represents an exemplary structure of strings, bit-lines, and word-lines.

A block 240 shown in FIG. 2 includes a predetermined number of strings 300, 301, 302, 303 shown in FIG. 3. The number of strings depends on the dimension of a page indicated in the specifications of the NAND memory device. The string 300 is composed by a predetermined number of memory cells 310 connected in series. This number depends on the process used to manufacture the NAND memory device. The string 300, 302 is connected to a bit-line BL0 through a drain-side selector cell or DST 325 and to a common source line SL through another source-side selector cell or SST 330. The gate of each cell is connected to a word line. For example, the gate of cell 311 is connected to WL1, and the gate of cell 312 is connected to WL2. The source selector cells or SST are connected to a common source line SL, thus one end of all strings is connected to the common source line SL.

A second string 301 and a fourth string 303 are coupled to a bit-line BL1, and to the common source line SL, so they also shares the common source line SL and the bit-line BL1.

Each string may be activated by controlling signals applied to the selection lines DSL and SSL. By switching the selector cells (transistors) 325, 330 on, the first string 300 can be made electrically connected to the bit-line BL0, and may pull current from it based on whether the gate of the memory cells 310, 311, 312 stores electrons or not.

To read a data stored in a specific memory cell, e.g. a memory cell 311, word lines WL0, WL2, WL3 except WL1 are controlled to be pulled up far above the threshold voltage, while the word line WL1 is controlled to be pulled up over the threshold voltage of an erased cell and below the threshold voltage of a programmed cell. SST and DST cells are switched to make inner cells to connect to the bit line BL0. Regardless of the bit stored in the memory cells 310, 312, 313, specifically a data bit stored in the floating gate of the memory cell, the memory cells 310, 312, 313 are turn into conduction by the high voltage applied thereto. For the memory cell 311, because a voltage just over the threshold voltage of an erased cell is applied to the control gate of the memory cell 311, if electrons are trapped in the floating gate of the memory cell 311, the voltage of the control gate is cancelled or partially screened by the trapped electrons, thereby the drain and source terminals of the memory cell 311 are open, and no current flows through the chain of the first string 300. Alternatively, if there-are no trapped electrons, the memory cell 311 will conduct, then current may flow through the first string 300. In this way, the current flowing from the bit-line to the source terminal or from the source terminal to the bit-line may be controlled. If the cell is erased and no electrons are trapped the cell is conductive and sensed as 1. On the contrary, a programmed cell with trapped electrons remains off state and is sensed as 0. This is an exemplary read operation of a string in the NAND flash memory.

The string structure 300 is repeated along an X-direction, which is indicated as S0, S1, . . . $S_k$ in FIG. 2. The string structure 300 is also repeated along a Y-direction (or bit-line direction). The first and second strings 300, 301 lie in the same block, and the third and fourth strings 302, 303 lie in the same block. The DST and SST cells are controlled to select a block in the memory array.

BL0 is indicated as an even bit-line, and BL1 is indicated as an odd bit-line. Likewise, BL2, BL4, BL6, etc. can be referred to as even bit-lines, and BL3, BL5, BL7, etc. can be referred to as odd bit-lines. In a few architectures, even and odd bit-lines are selected alternatively, so that they can be read and programmed separately.

During page read and page program operations, the selected word line, the unselected word lines and the selectors gate cells, DST and SST, should be biased to a proper voltage with an established signals sequence. Word lines WL0~WL7 and selector lines DSL0, DSL1, SSL0, SSL1 are as long as the whole array width in X direction. Moreover, the distance between a word line and another, e.g. between WL0 and WL1, is equal to the minimum technological width and this distance is only a bit lower than the distance between a selector line and an adjacent word line, e.g. between WL0 and DLS0. As a consequence, the capacitance of these lines is not negligible and should be charged and discharged by using suitable voltage sources, usually charge pumps or voltage regulators.

Moreover, the coupling parasitic capacitance between one word-line and another, e.g. between WL0 and WL1, and between selector lines and adjacent word lines, e.g. between WL0 and DLS0, can be relevant. This means that, driving a line to a proper voltage, the adjacent lines are disturbed and their voltage value tends to rise or drop, depending if the adjacent line is charged or discharged respectively. Since word lines, e.g. WL0, WL1, and selector lines, e.g. DSL0, are resistive and capacitive, a settling time is necessary to restore the correct voltage biasing on a line after it has been disturbed by adjacent lines voltage variation.

The settling time means the time required to recover the desired voltage on the line. The minimum settling time, related to the resistance and capacitance of the line, is ensured by a good driving capability of the used voltage source. In the same way, a good driving capability of the voltage source ensures the minimum rising or discharge time for the word lines and selector lines which is related to the time constant of these lines $\tau = *R*C$ where R and C are the line resistance and capacitance, respectively.

FIG. 4 schematically represents a detailed structure of the row driver 245, the switch 220, and the voltage regulator 215 of FIG. 2.

The switch 220 includes a switch driving circuitry 400 which connects one of lines $V_{x0}, V_{x1}, V_{x2}, \ldots, V_{xn+1}$ to the voltage regulator through as example pass transistors like M1. The switch driving circuitry 400 controls the transistors like M1 to switch on or off the transistor M1. When the transistor M1 is switched on (is rendered conductive), the current flowing is produced between the voltage regulator 215 and the proper Vx line coupled to the row driver 245. Lines $V_{x0}, V_{x1}, V_{x2}, \ldots, V_{xn+1}$ will be also referred to as $V_x$ lines.

The row driver 245 includes a row driver driving circuitry 405 and a plurality of transistors $T_0, T_1, \ldots, T_n, T_{n+1}$. The plurality of transistors $T_0, T_1, \ldots, T_n, T_{n+1}$ are connected to lines $V_{x0}, V_{x1}, V_{x2}, \ldots, V_{xn+1}$, respectively. If a user operation is requested on a page of a block, the row driver driving circuitry 405 controls the plurality of transistors $T_0, T_1, \ldots, T_n, T_{n+1}$ to deliver correct biasing from Vx lines to each of the word lines $WL_0$~$WL_k$ and gate selector lines SSL, DSL. $V_x$ lines are as long as the whole matrix in Y direction, since they connect all the row drivers. These lines are usually designed with metal connection and ensure low resistivity. Their capacitance, instead, can be high due to the line length. Moreover, $V_x$ lines are designed in parallel and often capacitively coupled one to another. $V_x$ lines receive their biasing through switches 220 which connect the output of voltage regulators (as 215 in the picture) to $V_x$ lines. One voltage regulator can be connected to a single Vx line or more, depending on the required voltages and sequences.

In FIG. 4, it is shown that only one voltage regulator 215 to provide a bias voltage. However a plurality of voltage regulators can be used, each of the voltage regulators being connected to a different Vx line ore more than one Vx line.

To read data stored at a specific address at a certain point of time, the block storing the data should be firstly identified, then an exact word line in the block should be chosen. This operation can be performed by the row control system 120 and the row decoder 122 in FIG. 1. Then, based on the result of the row decoder 122, source selector line SSL, drain selector line DSL, selected word line, and unselected word line are identified. For example, if it is assumed to choose a word line $WL_1$ in FIG. 4 after an address decoding, the DSL and SSL lines of the same block are driven by the row driver to switch on the corresponding transistor. The lines except $WL_1$, i.e. $WL_0$, $WL_2$, $WL_3$, . . . , $WL_k$ are driven by the row driver to have a specific bias voltage which is different from the bias voltage for $WL_1$. In short, the unselected word lines, i.e. $WL_0$, $WL_2$, $WL_3$, . . . , $WL_k$, should be correctly biased even if it is not addressed in a user mode operation as read or program. In fact, as it is well known, erase operation involves the whole block which is globally addressed, while in read and program operations the user selects a word line by addressing it, also the other word lines of the same block and the related selectors having to be correctly biased.

When the output of the voltage regulator 215 is delivered to the word line or the selector line, the switch driving circuitry 400 is enabled and rises the pass gate voltage, i.e. the voltage value which enables the pass gate transistors. Also, the row driver 245 is enabled and connects in a similar way the $V_x$ lines to a desired word line or selected gate line. The voltage regulators 215 charge not only the word line $WL_0$~$WL_k$ and the selector lines SSL, DSL but also the $V_X$ lines connecting the row driver 245 to the switch 220.

FIG. 5A schematically shows a voltage regulator 501 being realized according to the prior art and being used for biasing a word line.

The voltage regulator 501 shown in FIG. 5A corresponds to the voltage regulator denoted by 160 in FIG. 1 or by 215 in FIGS. 2 and 4.

The voltage regulator 501 includes a two stage operational amplifier 500. The two stage operational amplifier 500 includes a first stage comprising an operational amplifier OP1 and a second stage including transistors M1, M2. Preferably, the second stage may be further coupled to capacitors C1, C2. The voltage regulator 501 further includes a transistor M3 connected as a follower configuration, and a divider R1. The divider R1 divides the regulator output voltage provide at the regulator output OUT and provides a feedback signal Vfeed to the non inverting input + of the OP1, which is the inverting input of the voltage regulator as a whole, since the transistor M2 acts as an inverting stage. In particular, it should be remarked that the second stage is an inverting stage so the positive input of the first stage is the inverting input of the regulator. The feedback is always provided to the inverting input of the voltage regulator. In the second stage, a first transistor M1 works as a current reference and a current mirror. In particular, the first transistor M1 is able to replicate on its drain terminal the same current of a current generator, multiplied by a constant factor. A specific structure of the voltage regulator 501 is shown in FIG. 5B.

An output signal at an output terminal OUTa of the first stage of the two stage operational amplifier 500 is amplified by a second transistor M2 of the second stage. A further output signal at an output terminal OUTb of the second stage of the two stage operational amplifier 500 is provided to the gate of the transistor M3 in follower configuration.

The output terminal OUT of the voltage regulator 501 provides an output voltage Vout being substantially a constant voltage to other circuitry. Such an output voltage Vout is determined based on a reference voltage Vref provided to the non inverting terminal of the operational amplifier and the resistance ratio of the divider R1. A feedback signal Vfeed at the non-inverting input (+) of the operational amplifier OP1 of the first stage is determined by the dividing ratio (a:b) of the divider R1, according to following formula:

$$Vfeed = \frac{a}{a+b} Vout$$

The operational amplifier OP1 of the first stage compares two inputs, i.e. the reference voltage $V_{ref}$ and the feedback signal Vfeed, and when there is a slight change of the value of the feedback signal Vfeed, the output voltage at the output terminal OUTa of the first stage changes to adjust the output voltage Vout to a specific value. This is called negative feedback. Due to the negative feedback configuration, the output voltage Vout remains stable and constant.

In this way, when the reference voltage $V_{ref}$ is fixed and the dividing ratio (a:b) of the divider R1 is fixed, the output voltage Vout is regulated, controlled or produced by the voltage regulator 501 so as to be constant.

On the other hand, the output voltage Vout is varied as follows. The dividing ratio (a:b) of the divider R1 may be digitally controlled by a control signal. By changing the dividing ratio (a:b) of the divider R1, it is possible to change the output voltage Vout of the output terminal OUT of the voltage regulator 501. Alternatively, the reference voltage $V_{ref}$ may be changed in order to control the output voltage $V_{out}$. Hence, by changing such parameters as the dividing ratio (a:b) and/or the reference voltage $V_{ref}$, the output voltage Vout can be changed from a high voltage level to a low voltage level for example, from Va (5 V) to Vb (2.5 V).

FIG. 5B shows an exemplary circuit structure of the voltage regulator of FIG. 5A. The dot-block denoted by OP1 shown in FIG. 5B corresponds to the OP1 shown in the two stage operational amplifier 500 in FIG. 5A. The current mirror blocks 510 and 520 are newly shown here in FIG. 5b, which are omitted to be shown in FIG. 5 A for simplicity.

The operational amplifier OP1 of FIG. 5A has a differential amplifier configuration. In particular, such an amplifier includes five transistors M5, M6, M7, M8, M9. The gate terminals of the transistors M5 and M6 are coupled to each other. The drain and gate terminals of the transistor M5 are connected with each other. The differential input voltage values, $V_{feed}$ and Vref, are provided to the transistors M7 and M8. In particular, the feedback signal Vfeed is provided to the gate terminal of the transistor M7, and the inverting input voltage, i.e. the reference voltage $V_{ref}$ is provided to the gate terminal of the transistor M8. The output voltage at the output terminal OUTa of the first stage is generated at the connection of the transistors M6 and M8. The gate terminal of the transistor M9 is provided with a bias voltage from a current mirror block 510. The transistor M9 thus provides a constant current into the first stage, in particular to the operational amplifier OP1, due to the current mirror block 510.

The current mirror block 510 is realized by an improved Wilson current mirror to reduce the channel length modulation effect on the p-MOS transistors M9, M10, M11, M12, which could cause a mismatch on the current mirrored for the operational amplifier OP1 of the first stage and the second stage, i.e. the transistor M1, of the two stage operational amplifier 500.

The transistors M13 and M14 replicate a current $I_{src}$ being provided by a current source and flowing through the transistor M14 to the drain and source terminals of the transistor M13. The amount of the current as replicated depends on the ratio of channel width of both transistors M13 and M14, being the length of M13 and M14 are always the same. Same amount of the replicated current on the transistor M13 flows through the transistors M10 and M12.

The transistor M12 is coupled with the transistor M11 and the transistor M1 for realizing a current mirror configuration. For example, it is assumed that a current I is flowing through the transistor M12, the mirroring factor for the transistor M11 is N, and the mirroring factor for the transistor M1 is M. Then, the current I is mirrored and multiplied by a factor N to bias the operational amplifier OP1 of the first stage. Similarly, the current I is mirrored and multiplied by a factor M to bias the second stage, specifically the transistor M1.

The current $I_{div}$ flowing through the divider R1 is dependent on the output voltage Vout of the output terminal OUT and the total resistance value of the divider R1. Under the hypothesis that no current consumption is present to the external load coupled with the output terminal OUT, the current $I_{div}$ flows inside the transistor M3. In this case, the total power consumption of the voltage regulator 501 is as follows:

$$I + N \cdot I + M \cdot I + I_{div} = (M + N + 1) \cdot I + \frac{V_{out}}{R1}$$

All these parameters are established during the design phase and they should be thus under control.

In FIG. 5B, a current flow indicted as $I_{out}$ is shown. The current flow is produced in a charging phase. To charge the Vout node is needed in several cases such as during a rising transient or when a sudden drop of the output voltage $V_{out}$ occurs. In the charging phase, a high current is sunk from the output terminal OUT to the external load, and the follower, i.e. the transistor M3, is able to provide a very high current. This charge is accomplished by the current flow indicted as $I_{out}$ in FIG. 5B.

The sizing of the transistor M3 may be chosen appropriately to charge an external capacitive load in a short time. The current $I_{out}$ should be high enough to charge the word lines or selector line of FIG. 4 within a proper time. This fast charge can be carried out by the transistor M3, so this circuit configuration works well when it needs to charge the load into a specific voltage or when there is a sudden voltage drop.

In FIG. 5B, another current flow indicated as $I_{dis}$ is shown. The current flow is produced in a discharging phase. To discharge the Vout node is needed in several cases such as when the output voltage Vout happens to be higher than the desired voltage, when a coupling effect as raising the output line for example word line or gate selector line occurs and the output line is needed to be decreased from its raise, when a sudden surge of the output voltage Vout occurs, when the external capacitive load is required to be discharged to adjust the output voltage Vout to a lower desired voltage, or when a bias voltage of the output line (i.e. word line or gate selector line) coupled to the Vout node of the voltage regulator changes from a high voltage level to a low voltage level, for example from Va (5 V) to Vb (2.5 V). The discharge is accomplished by the only current flow indicted as $I_{dis}$ in FIG. 5B.

However, in the discharging phase, a long time is needed to discharge the external capacitive load (i.e. the Vout node of the voltage regulator) through the divider R1, where a discharge current $I_{dis}$ flows through the divider R1 itself to the ground. The discharge current $I_{dis}$ is inevitably small since the resistance value of the divider R1 should be high in order to limit the DC power consumption occurring at the divider R1. For instance, the discharge current $I_{dis}$ should be few μA or tens of μA. To discharge the Vout node as explained above is accomplished because of the only discharge path indicated by $I_{dis}$, and thus another discharge path discharging the Vout node, which is differently from this discharge path, is not provided.

Therefore, the technical problem of the voltage regulator according to the prior art lies in that the speed of discharging in the discharge phase is not fast, which degrades the performance of a NAND flash memory.

SUMMARY OF THE INVENTION

According to an embodiment, a device includes an amplifier including a first input terminal supplied with a reference voltage, a second input terminal supplied with a feedback voltage, and an output terminal, first and second power supply lines, an internal node, a first transistor coupled between the first power supply line and the internal node and including a gate terminal supplied with a bias voltage, a second transistor coupled between the internal node and the second power supply line and including a gate terminal coupled to the output terminal of the amplifier, an output node, a third transistor coupled between the first power supply line and the output node and including a gate terminal coupled to the internal node, a divider coupled between the output node and the second power supply line and configured to produce a first discharge path from the output node to the second power supply line to establish the feedback voltage, and a first switch circuit supplied with a first signal and coupled between the output node and the internal node.

According to another embodiment, a device includes a data line, a regulation circuit configured to receive a reference voltage and a feed back signal which is fed back from the data line, and output a first signal, a transistor configured to receive the first signal, the transistor being deactivated when receiving a first logic level of the first signal in order to apply a first power supply voltage on a first power supply line to the data line, and the transistor being activated when a second logic level of the first signal in order to stop applying the first power supply voltage to the data line, and a discharge circuit provided between the transistor and the data line to produce a discharge path between the transistor and the data line when the transistor is activated, in order to discharge a charge on the data line via the activated transistor to a second power supply line supplied with a second power supply voltage different from the first power supply voltage.

According to still another embodiment, a method includes providing a device which comprises a flash memory cell coupled to a data line, a voltage regulator coupled to the data line, the voltage regulator including a first switch circuit coupled to the data line, providing the voltage regulator of the device with a first discharge path to discharge the data line, rendering the first switch circuit conductive; and providing a second discharge path to discharge the data line via the conducted switch circuit when the first discharge path is provided, the first and second discharge paths being different from each other.

DETAILED DESCRIPTION OF THE EMBODIMENTS

The present disclosure makes reference to a flash memory device, by way of example, a NAND type flash memory, usually comprising an extra memory array for storing redundancy information and/or configuration information, and a sensing circuit for accessing data stored in the extra memory array.

Figure 6A:
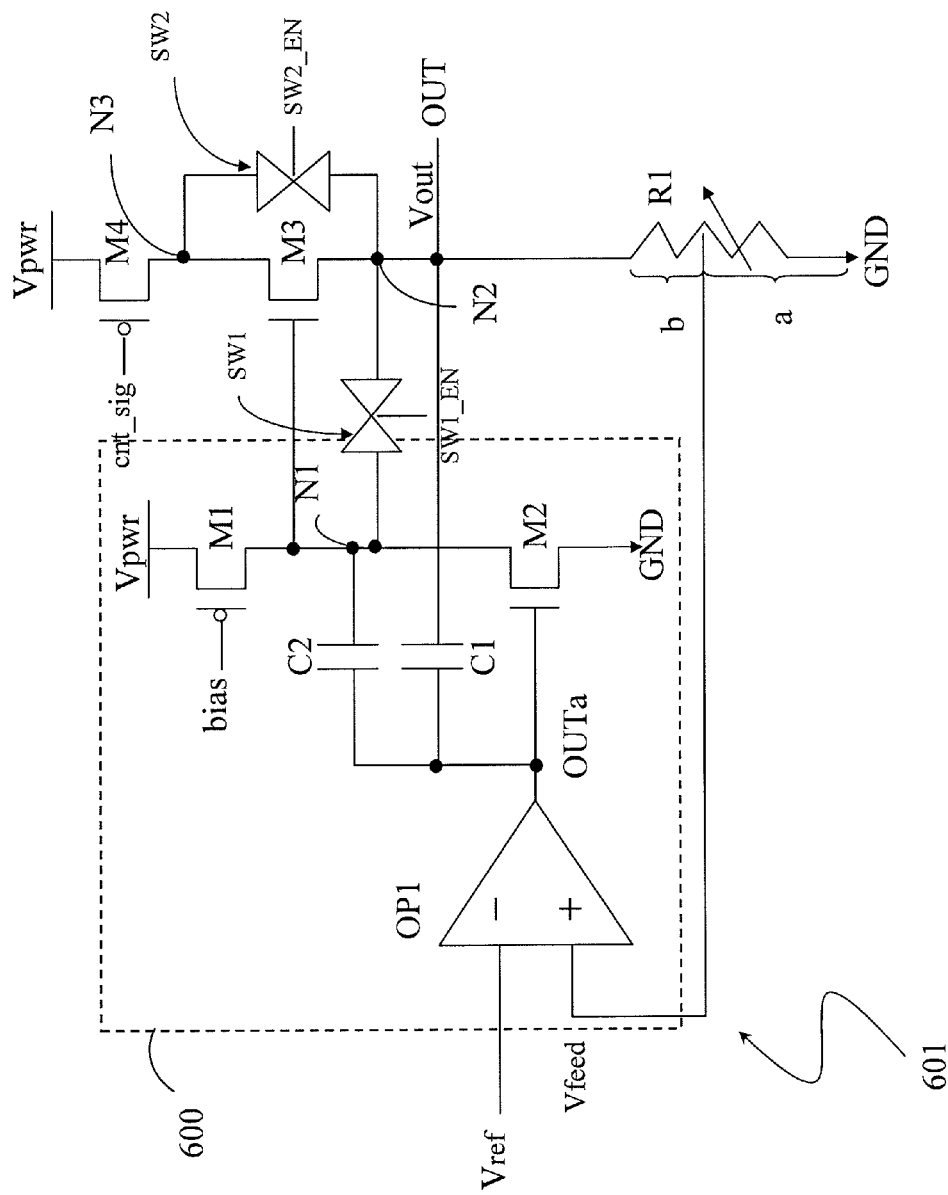
FIG. 6A shows a voltage regulator according to a first embodiment of the invention.

FIG. 6A shows a voltage regulator 601 according to a first embodiment of the invention. Differently from the regulator circuit shown in 5A, first and second switches denoted by SW1 and SW2 and the transistor M4 are newly disclosed in the voltage regulator shown in FIG. 6A.

Figure 2:
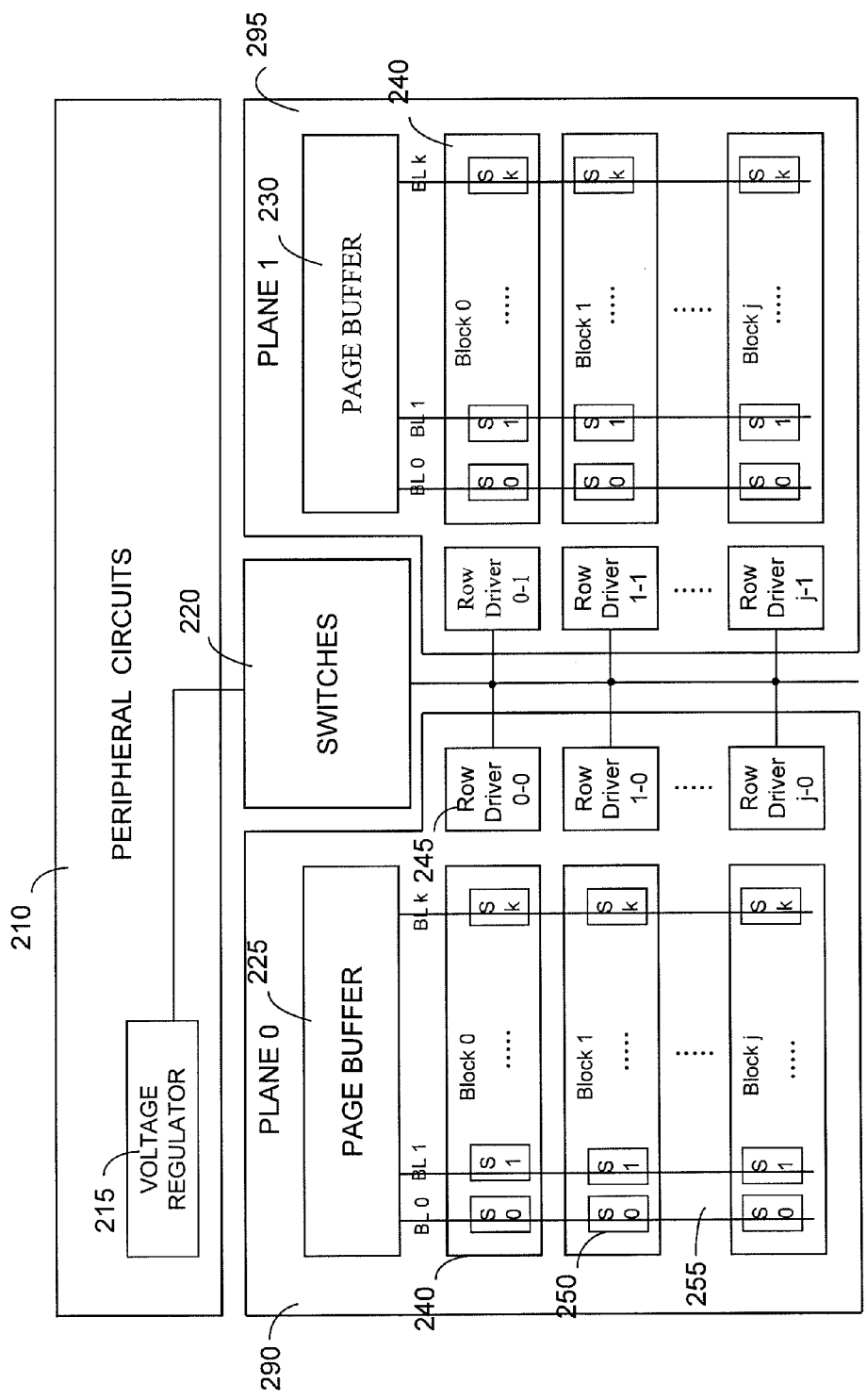
FIG. 2 schematically shows an exemplary cell matrix organization and driving circuitry of NAND memory of the known type.
Figure 3:
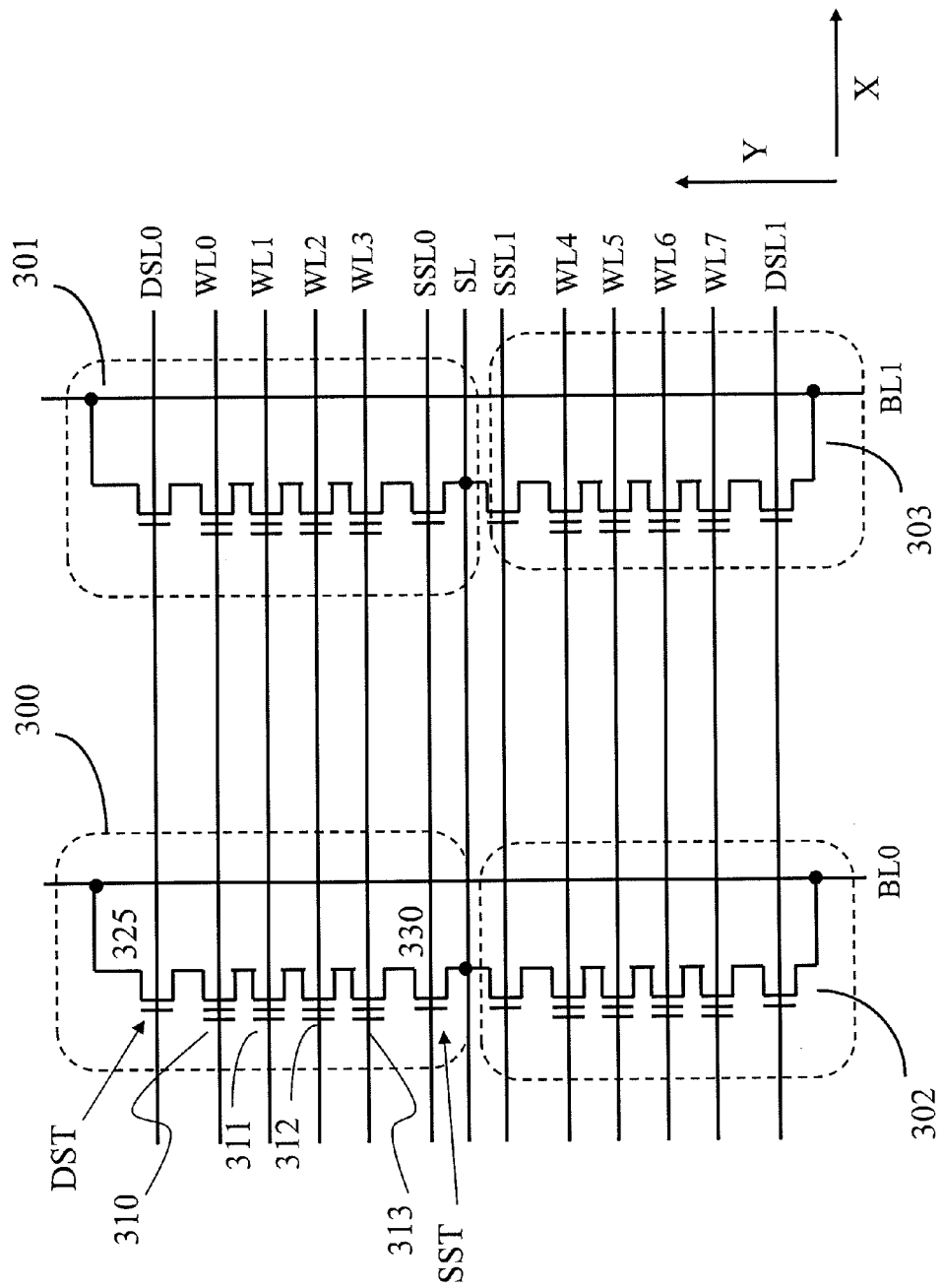
FIG. 3 schematically shows an exemplary structure of strings, bit-lines, and word-lines.
Figure 4:
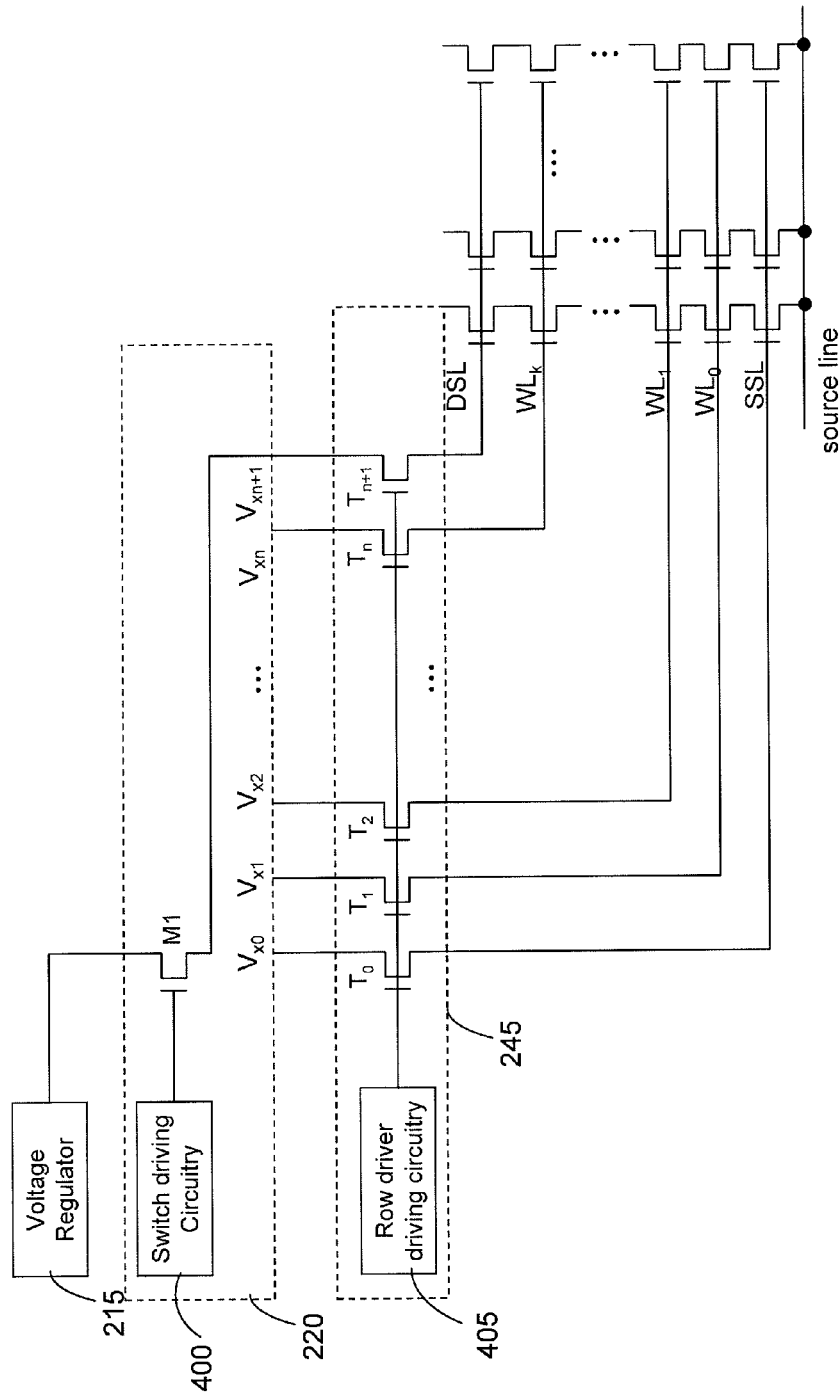
FIG. 4 schematically shows a detailed structure of row driver, switch, and voltage regulator of FIG. 2.

The voltage regulator 601 provides a bias voltage to a plurality of row drivers in the NAND memory, for instance the one shown in FIGS. 2 and 4. The voltage regulator 601 includes a first stage amplifier OP1, a first transistor M1, a second transistor M2, a third transistor M3, a fourth transistor M4, a first capacitor C1, a second capacitor C2, a divider R1, a first switch SW1, and a second switch SW2. The first stage amplifier OP1 is provided with a reference voltage $V_{ref}$ on its inverting input (−), which is the non inverting input of operational amplifier as a whole. The gate terminal of the first transistor M1 is provided with a bias voltage. One conduction terminal of the first transistor M1 is connected to a circuit reference voltage or power supply voltage Vpwr while the other conduction terminal of the first transistor M1 is connected to the second transistor M2. The gate terminal of second transistor M2 is connected to an output terminal OUTa of the first stage amplifier OP1, and one conduction terminal of the second transistor of M2 is connected to the ground voltage GND. The second capacitor C2 is coupled between the output terminal OUTa and a first internal node N1. The gate terminal of the third transistor M3 is connected to the first internal node N1. One conduction terminal of the third transistor M3 is connected to an output terminal OUT of the voltage regulator 601, while the other conduction terminal of the third transistor M3 is connected to a further internal node N3 which is in turn connected to a conduction terminal of the fourth transistor M4. The output terminal OUT may be connected to an external load, in particular the word-lines or the gate terminal of a block selector.

According to an aspect of the invention, the second capacitor C2, has a capacitance value which is smaller than a predefined value so that bump does not occur when the first switch SW1 and/or second switch SW2 switches.

The fourth transistor M4 is provided with a control signal cnt_sig on its gate terminal, while the other conduction terminals are connected to the circuit reference voltage Vpwr and the further node N3, respectively. The divider R1 includes three terminals connected to the non-inverting input (+) of the first stage amplifier OP1, the ground voltage GND and a second internal node N2, respectively. The voltage at the second internal node N2, i.e. $V_{out}$, is thus divided by the dividing ratio (a:b) of the divider R1 to generate the input voltage Vfeed of the non-inverting input terminal (+) of the first stage amplifier OP1, which is the inverting input of operational amplifier as a whole. The dividing ratio (a:b) may be controlled by control signals (unseen) in a digital mode.

The first switch SW1 has two terminals being coupled with the first internal node N1 and the second internal node N2, respectively. The first switch SW1 is provided with a first switch control signal SW1_EN. In particular, the first switch SW1 switches on or off based on the first switch control signal SW1_EN.

The second switch SW2 has two terminals being coupled with the second internal node N2 and the further internal node N3, respectively. The second switch SW2 is provided with a second switch control signal SW2_EN. In this way, the second switch SW2 switches on or off based on the second switch control signal SW2_EN.

The first and second switch control signals are delayed signal obtained by the control signal cnt_sig and delaying it by certain amount of time, which will be explained below in FIG. 7C.

The first switch SW1, the second switch SW2 and the fourth transistor M4 are thus controlled by the control signal cnt_sig, which can transform the circuit configuration dynamically. When the control signal cnt_sig is LOW, the first switch control signal SW1_EN and the second switch control signal SW2_EN are LOW but for a transitional status, being the first and second switch control signals, SW1_EN and SW2_EN, delayed signals with respect to the control signal cnt_sig. Then, the first switch SW1 and the second switch SW2 keeps OFF, while the fourth transistor M4 keeps ON. Thus, when the control signal cnt_sig is LOW, the circuit configuration is similar to the one describe with reference to the prior art.

If the voltage regulator 601 is supplied with a voltage produced by a charge pump, the first switch control signal SW1_EN and the second switch control signal SW2_EN can be furnished by voltage elevators in order to guarantee their functionality in the whole supply voltage range.

The third transistor M3 serves as a follower and receives the power supply voltage Vpwr through the fourth transistor M4. The first capacitor C1 guarantees the stability of the voltage regulator 601 by acting as a miller capacitance.

The specific numerical values of Vout, Vpwr, and R1 can vary according to a specific embodiment. The Vpwr voltage may be supplied and produced by a voltage generator circuit or a charge pump circuit. As an example, the upper limit of Vout may be 6 V, and the low limit of Vout may be 2 V. The Vpwr may have 12 V, and the R1 may have 500 KΩ.

The output voltage Vout is regulated, controlled or produced by the voltage regulator 501 so as to be constant, when the reference voltage $V_{ref}$ is fixed and the dividing ratio (a:b) of the divider R1 is fixed.

On the other hand, the output voltage Vout is changed from a high voltage level to a low voltage level, for example from Va (5 V) to Vb (2.5 V), by changing such parameters as the dividing ratio (a:b) of the divider R1 and/or the reference voltage $V_{ref}$.

Figure 6B:
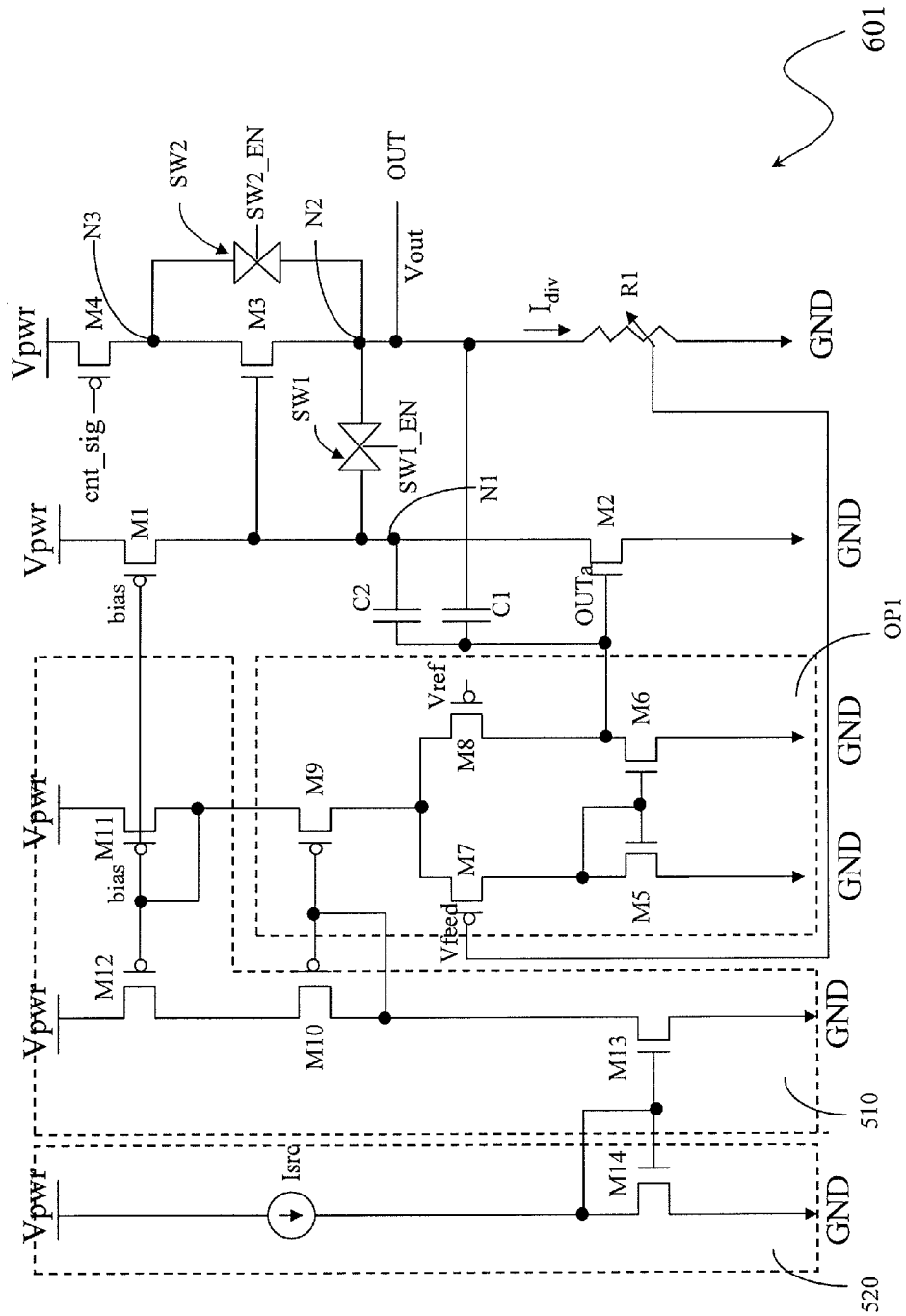
FIG. 6B shows a detailed exemplary structure of a voltage regulator according to the first embodiment of the invention.

FIG. 6B shows an exemplary detailed structure of the first stage amplifier OP1 and a current mirror of the voltage regulator 601 according to the first embodiment of the invention.

The first stage amplifier OP1 includes five additional transistors M5, M6, M7, M8, M9. The fifth transistor M5 and the sixth transistor M6 are connected to each other in correspondence of their gate terminal, and the drain terminal and the gate terminal of the fifth transistor M5 are short-circuited to each other. The source terminals of the fifth transistor M5 and the sixth transistor M6 are coupled with the ground voltage GND. The output terminal OUTa of the first stage amplifier OP1 is connected to the drain terminal of the sixth transistor M6. The gate terminal of the seventh transistor M7 is the non-inverting input (+) of the first stage amplifier OP1, while the gate terminal of the eight transistor M8 is its inverting input (−), which is feed by the reference voltage $V_{ref}$. The drain terminal of the seventh transistor M7 is connected to the drain terminal of the fifth transistor M5, and the drain terminal of the eighth transistor M8 is connected to the drain terminal of the sixth transistor M6. The source terminals of the seventh transistor M7 and the eighth transistor M8 are short-circuited to each other, and are connected to the drain terminal of the ninth transistor M9.

The voltage regulator 601 also includes first current mirror blocks 510 and 520 forming a current mirror and in turn including five further transistors and a constant current source. The gate terminals of the eleventh transistor M11 and of the twelfth transistor M12 are coupled to each other. The source terminals of the eleventh transistor M11 and of the twelfth transistor M12 are connected to the circuit reference voltage Vpwr. The gate and drain terminals of the eleventh transistor M11 are short-circuited to each other. The drain terminal of the eleventh transistor M11 is connected to the source terminal of the ninth transistor M9. The drain terminal of the twelfth transistor M12 is connected to the source terminal of the tenth transistor M10. The gate terminals of the tenth transistor M10 and of the ninth transistor M9 are coupled to each other, then connected to the drain terminal of the tenth transistor M10. The drain terminal of the tenth transistor M10 is coupled to the drain terminal of the thirteenth transistor M13. The source terminals of the thirteenth transistor M13 and of the fourteenth transistor M14 are coupled to the ground voltage GND. The gate terminals of the thirteenth transistor M13 and of the fourteenth transistor M14 are coupled to each other, then connected to the drain terminal of the fourteenth transistor M14. The constant current source $I_{src}$ is connected to the drain terminal of the fourteenth transistor M14.

The constant current source $I_{src}$ provides a constant current to the fourteenth transistor M14. The fourteenth M14 and the thirteenth M13 form a current mirror so that a current having an amount proportional to $I_{src}$ is mirrored on the drain terminal of the thirteenth transistor M13. The second current mirror block 510 of the current mirror acts as an improved Wilson current mirror. The current flowing through the twelfth transistor M12 and the tenth transistor M10 is replicated on the eleventh transistor M11 and on the ninth transistor M9 with a specific multiplication factor. The ninth transistor M9 provides a constant current to the rest of the first stage amplifier OP1. The fifth and sixth transistors, M5 and M6, operate as an active load for the differential input stage made by the seventh and eighth transistors, M7 and M8.

If the input voltage Vfeed of the non-inverting input terminal (+) of the first stage amplifier OP1 becomes higher than the reference voltage $V_{ref\ of\ its}$ inverting input (−) from the equivalent point, the gate-source voltage of the eighth transistor M8 becomes higher than the gate-source voltage of the seventh transistor M7 and more current starts flowing through the eighth and sixth transistors, M8 and M6. Then, the drain-source voltage of the sixth transistor M6, which is the output voltage at the output terminal OUTa of the first stage amplifier OP1, should increase drastically in order to justify the current flown through the sixth transistor M6.

On the contrary, if the input voltage Vfeed at the non-inverting terminal (+) of the first stage amplifier OP1 becomes smaller than the reference voltage $V_{ref}$ at its inverting terminal (−) from the equivalent point, the gate-source voltage of the eighth transistor M8 becomes smaller than the gate-source voltage of the seventh transistor M7 and more current starts flowing through the seventh and fifth transistors, M7 and M5. Then, the gate-source voltage of the fifth transistor M5 increases, while the drain-source voltage of the sixth transistor M6, which is the output voltage OUTa of the first stage amplifier OP1, should go down to decrease the current flowing through the sixth transistor M6.

In this way, the first stage amplifier OP1 amplifies the differential signal between its inverting and non-inverting input terminals.

Figure 7A:
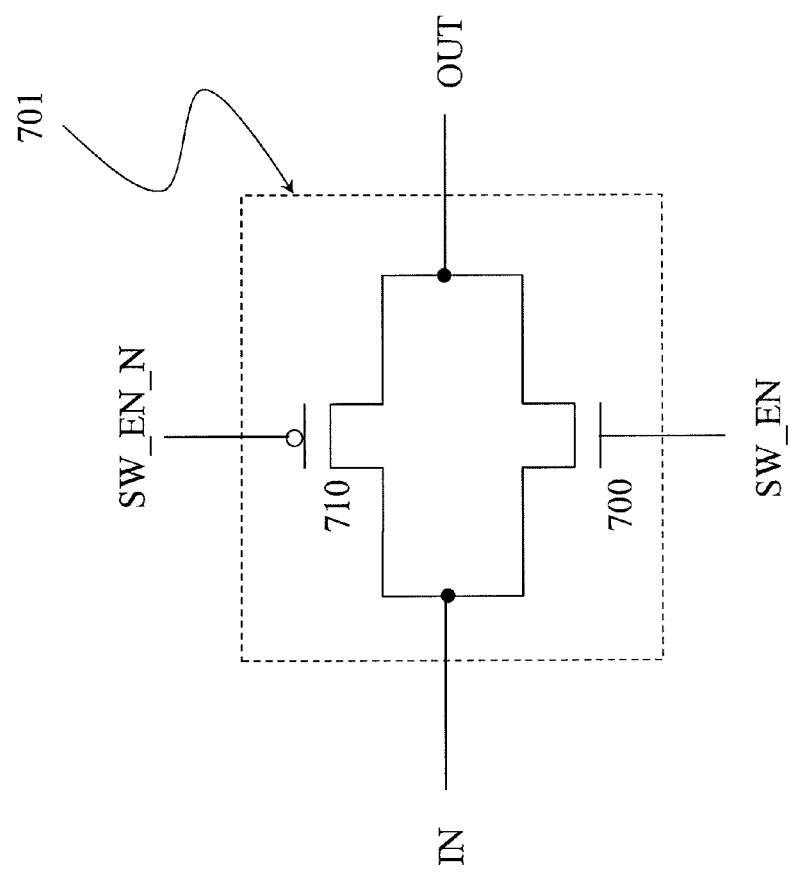
FIG. 7A schematically shows an exemplary configuration of the switch in the voltage regulator according to the embodiment of the invention.

FIG. 7A schematically shows an exemplary configuration of a switch included into the voltage regulator 601 according to an embodiment of the invention.

The switch 701 may include a n-MOS transistor 700 and a p-MOS transistor 710. The n-MOS transistor 700 receives a switch enable signal SW_EN on its gate terminal, and the p-MOS transistor 710 receives an inverted switch enable signal SW_EN_N on its gate terminal. The source terminal of the n-MOS transistor 700 is connected to the drain terminal of the p-MOS transistor 710, and the drain terminal of the n-MOS transistor 700 is connected to the source terminal of the p-MOS transistor 710. An input signal at an input terminal IN is provided to one conduction terminal of the n-MOS transistor 700, and an output terminal OUT is connected to the other conduction terminal of the n-MOS transistor 700. When the switch enable signal SW_EN is high, the inverted switch enable signal SW_EN_N is low and the switch 701 is ON so as to conduct the input signal to the output terminal OUT. Thus, when the switch enable signal SW_EN is high, the input terminal IN and the output terminal OUT can be regarded as short-circuited one another. When the switch enable signal SW_EN is low, the inverted enable signal SW_EN_N is high and the switch 701 is OFF, thus can be regarded as an open circuit. Advantageously, using a pair of MOS transistors can prevent the threshold voltage attenuation occurring between the two terminals of the switch 701. In an alternative example, only a p-MOS transistor or a n-MOS transistor can be used for the switch depending on the regulator output range. If the threshold voltage attenuation is allowed for the switch 701, this alternative configuration may be used.

Figure 7B:
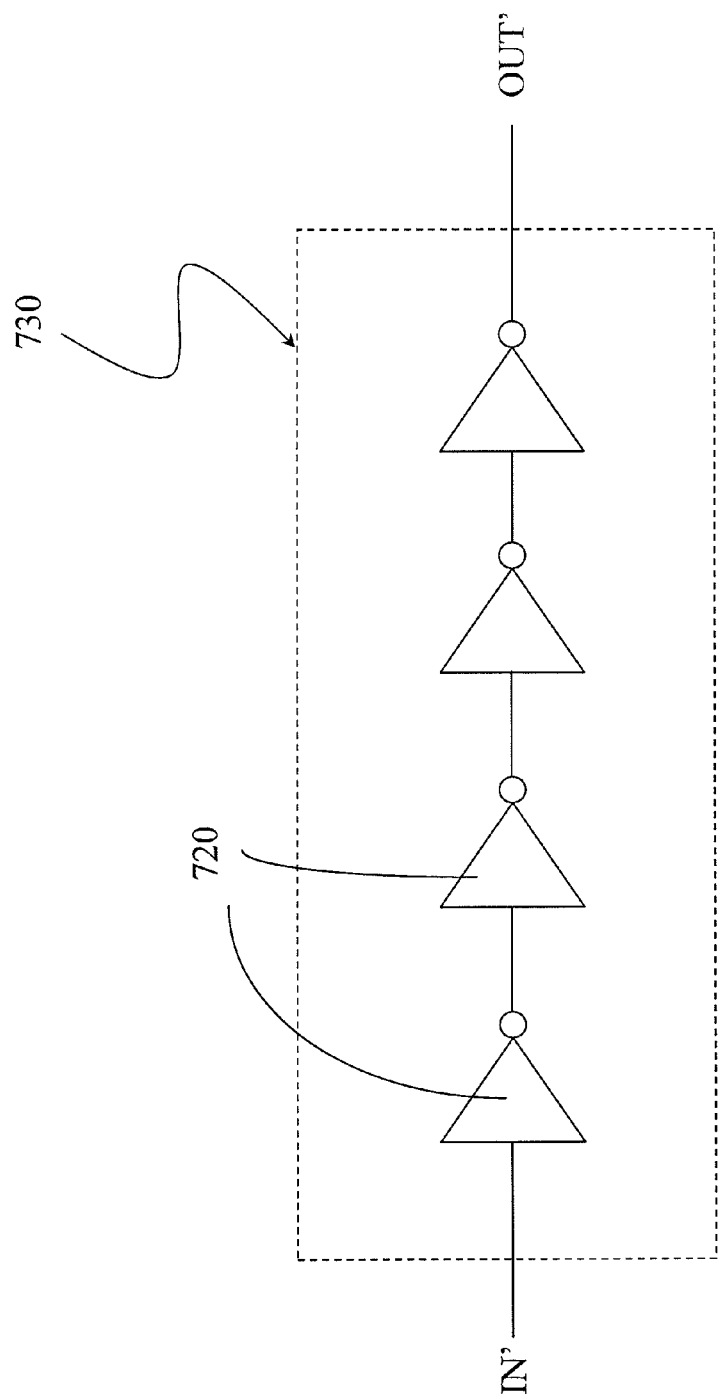
FIG. 7B schematically shows an exemplary configuration of the delay element according to the embodiment of the invention.

FIG. 7B schematically shows an exemplary configuration of a delay element 730 according to an embodiment of the invention.

The delay element 730 includes a plurality of inverters 720 serially connected to one another between an input and output terminals, IN' and OUT'. The number of inverters has to be even to recover the same polarity of an input signal at the input terminal IN'. Each inverter 720 has a propagation delay, so by adjusting the number of inverters used in the delay element 730, the amount of delay can be adjusted. Active circuit elements can be used to implement the delay element 730, but it is also possible to use passive circuit elements such as resistors and capacitor to implement it. The one shown in FIG. 7b is only an exemplary implementation of the delay circuit 730, and the scope of the invention is not limited thereto.

Figure 7C:
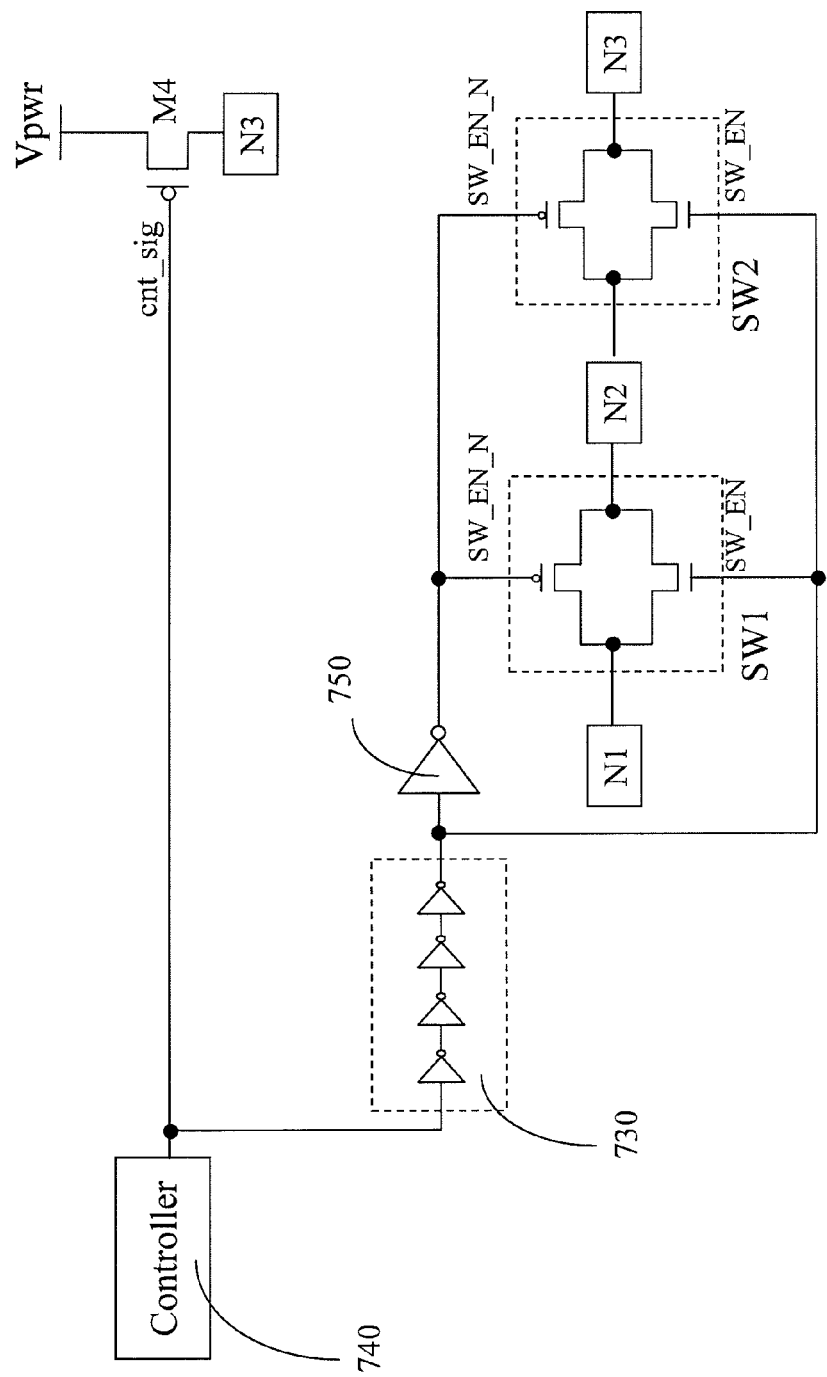
FIG. 7C schematically shows an exemplary circuit configuration of first, second switch and fourth transistor according to the embodiment of the invention.

FIG. 7C schematically shows an exemplary circuit configuration of the first and second switches as well of the fourth transistor according to the embodiment of the invention.

Figure 1:
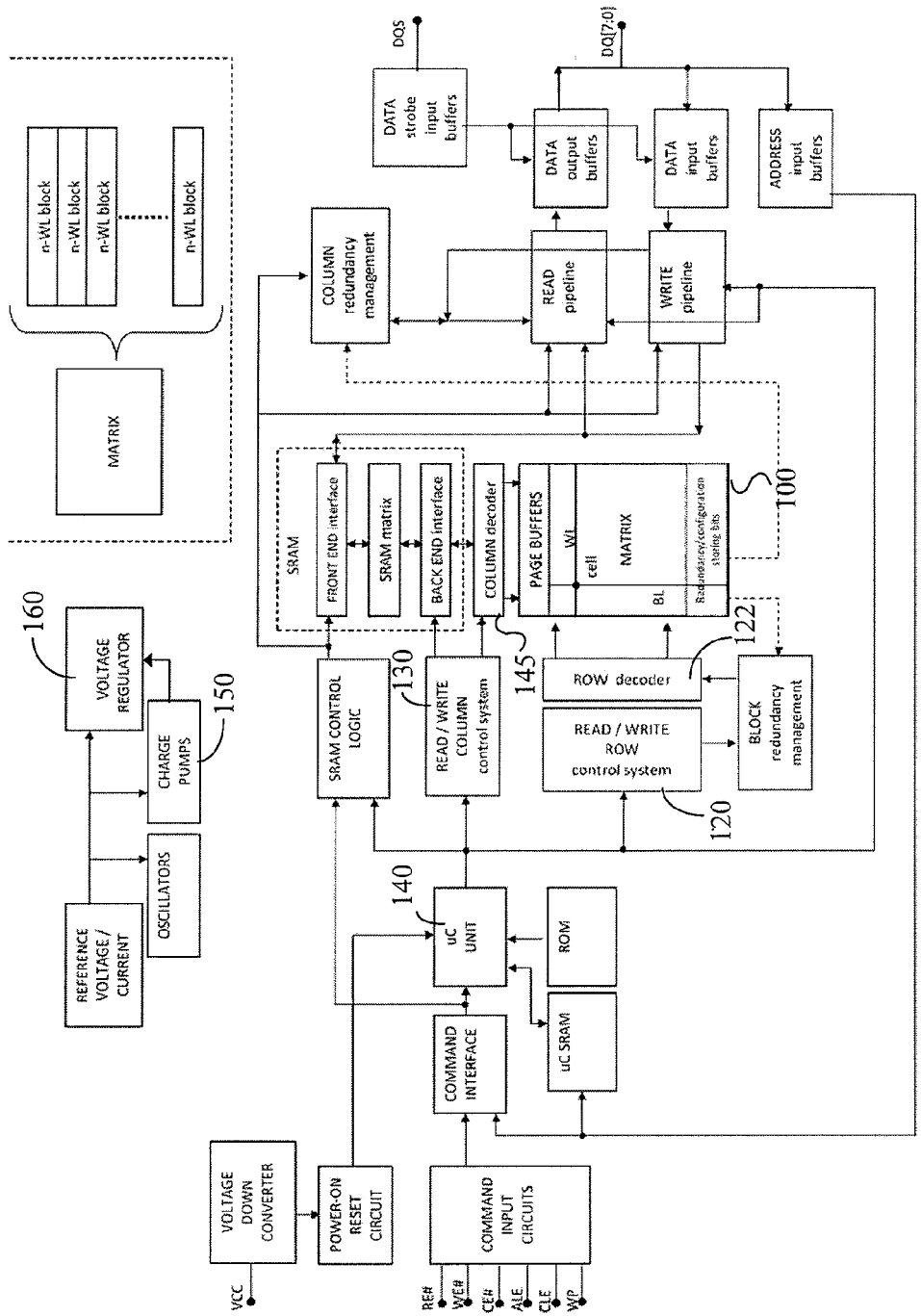
FIG. 1 schematically shows an exemplary structure of a known type of a memory and memory controller in general.

A controller 740 provides the control signal cnt_sig to the gate terminal of the fourth transistor M4. The controller 740 may be a controller such as the uC UNIT 140 shown in FIG. 1. The controller 740 may control the control signal cnt_sig based on external signals which are used to control a NAND memory, such as the word line selection signal, erase command, programming command, reading command from address decoder, and the like, In particular, the controller 740 can activate the control signal cnt_sig depending on the operation to be performed and also on the specific phase of that operation. In different phases of the same operation the controller 740 can first activate the control signal cnt_sig to charge a capacitive load and then deactivate it to discharge the capacitive load to a lower controlled voltage.

The control signal cnt_sig is delayed by the delay element 730. Then, the delayed control signal at the output terminal of the delay element 730 is inverted by a inverter 750 and provided as inverted switch enable signals SW_EN_N to the first switch SW1 and the second switch SW2. The delayed control signal at the output terminal of the delay element 730 is provided as switch enable signal SW_EN_N to the first switch SW1 and the second switch SW2. As depicted in FIG. 6A and FIG. 6B, the first switch SW1 connects the first internal node N1 to the second internal node N2, while the second switch SW2 connects the second internal node N2 and the further internal node N3. The fourth switch M4 is connected to the further internal node N3.

The control signal cnt_sig starts LOW and the fourth transistor M4 is in its conduction state, and the first switch SW1 and the second switch SW2 switch in their not conduction states, while the fourth transistor M4 is on state. Then, when the control signal cnt_sig becomes HIGH, the fourth transistor M4 turns in its not conduction state, and, with a certain amount of delay, the first switch SW1 and the second switch SW2 start to conduct. At this phase, the internal nodes, N1, N2, and N3, are short-circuited, while the fourth transistor M4 becomes open. The control signal cnt_sig thus changes the circuit configuration. In this regard, particular operations of the circuit with varying configuration will be explained with reference to FIGS. 8A, 8B, and 8C.

Figure 8A:
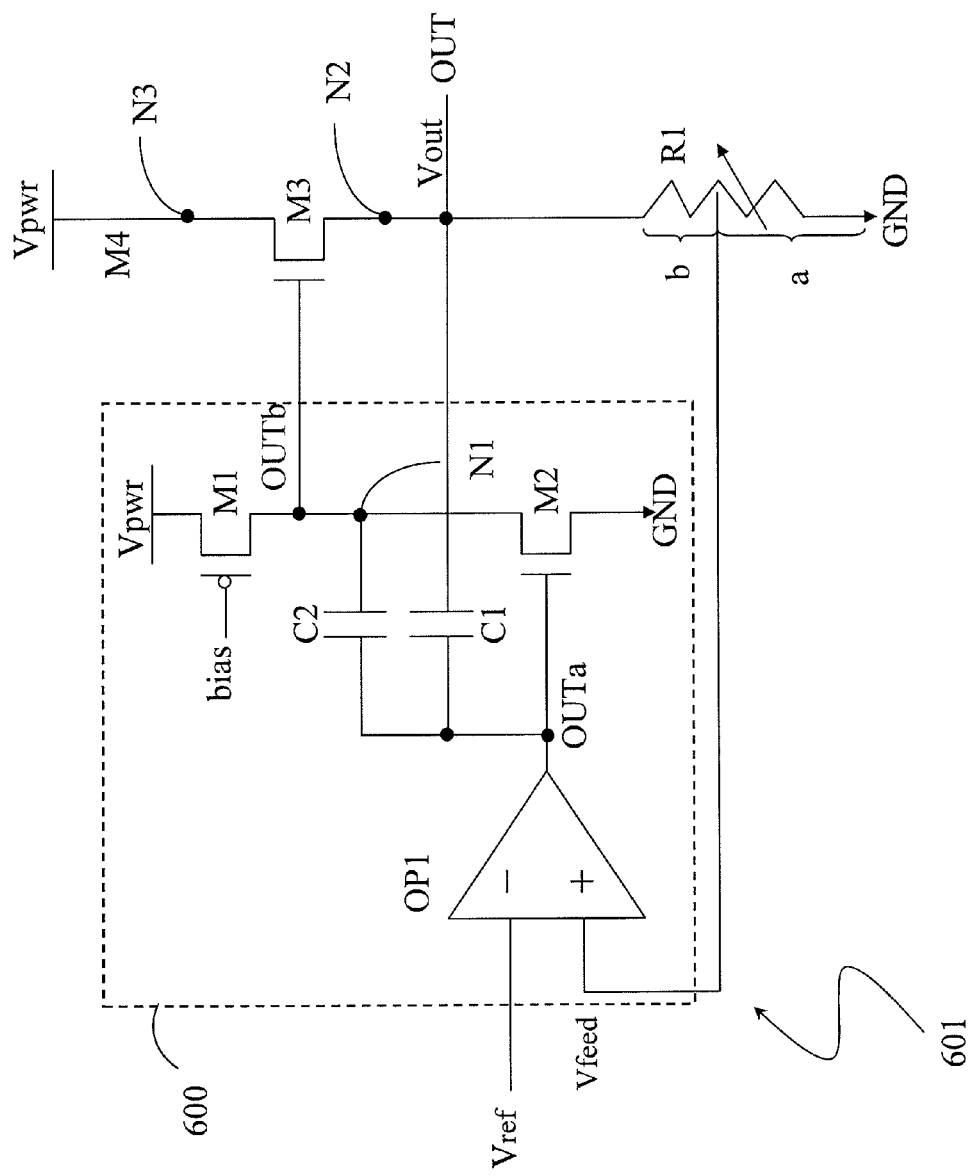
FIG. 8A schematically shows a simplified configuration of the voltage regulator according to the embodiment of the invention, in a charging phase.

In particular, FIG. 8A schematically shows a simplified configuration of the voltage regulator 601 during a charging phase according to the embodiment of the invention. Moreover, FIG. 8B schematically shows a simplified configuration of the voltage regulator 601 during a discharging phase according to the embodiment of the invention.

Figure 8B:
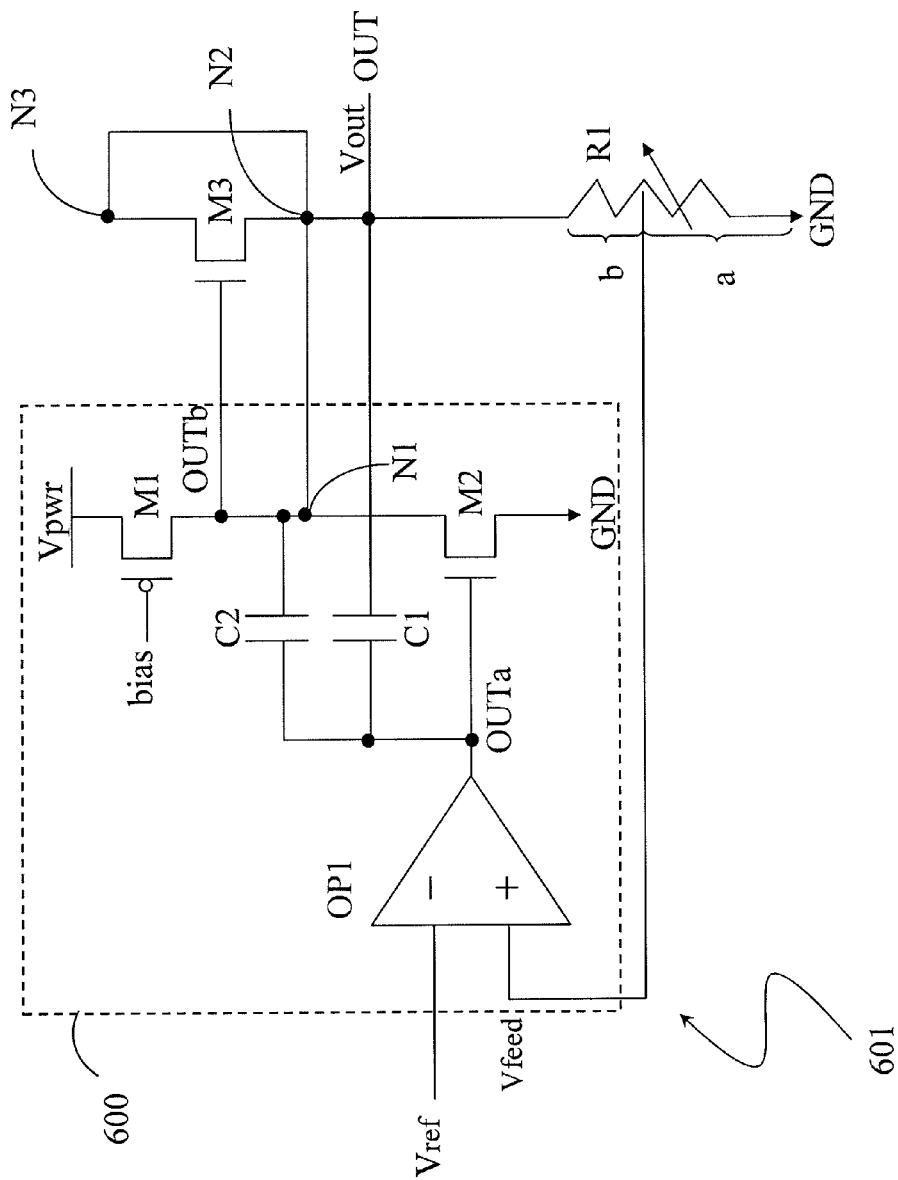
FIG. 8B schematically shows a simplified configuration of the voltage regulator according to the embodiment of the invention, in a discharging phase.

To explain the operation of the circuit more intuitively, the circuit drawn in FIG. 6A has been simplified by removing the details of the current mirror and the first stage amplifier as shown in FIGS. 8A and 8B.

Figure 8C:
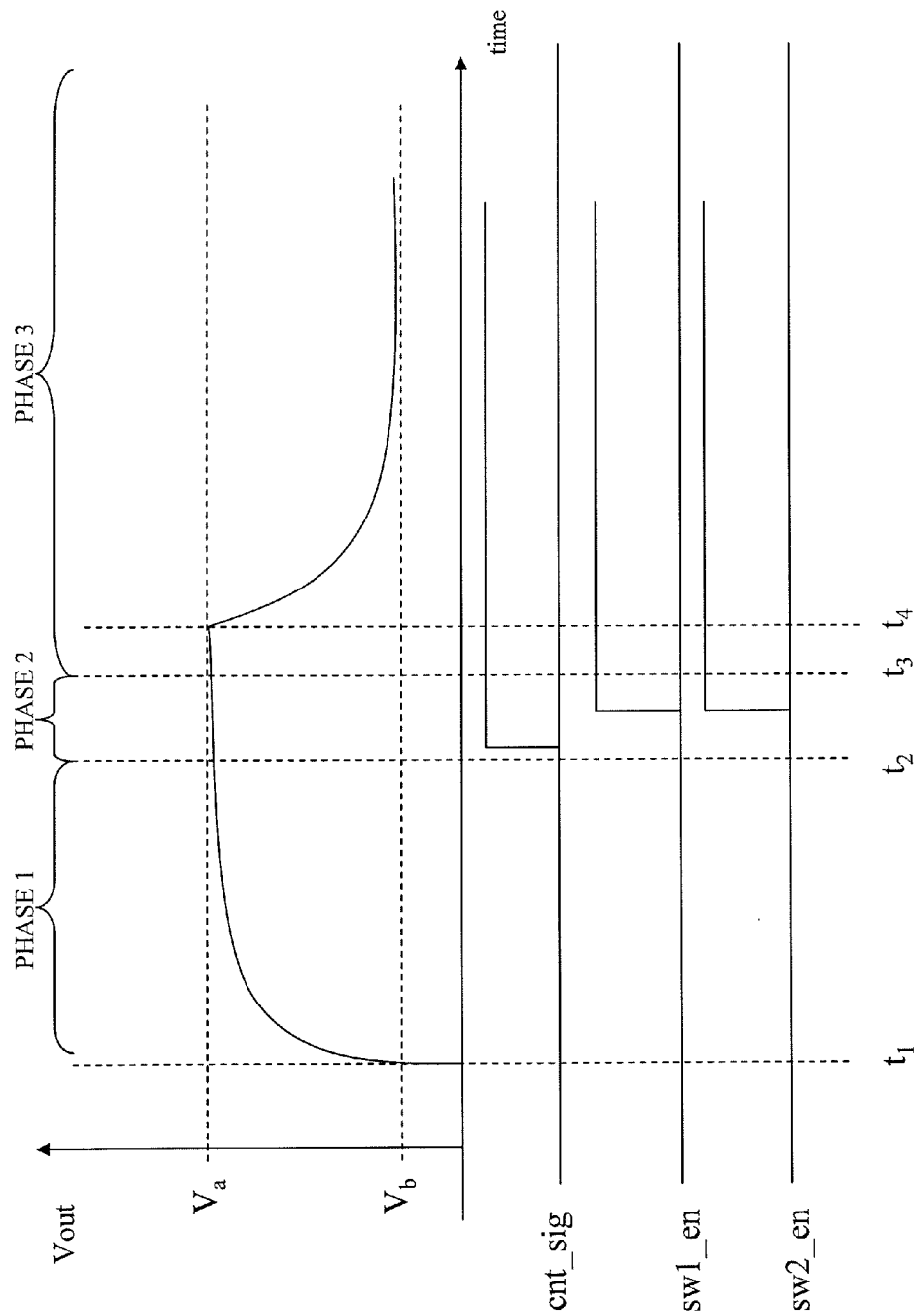
FIG. 8C schematically shows the exemplary graph for the phases, including the charging phase and discharging phase, of the voltage regulator according to an embodiment of the invention.

It is also remarked that the charging phase means the phase when the load of the voltage regulator needs to be charged to a specific target voltage. For example, the charging phase has the time period while the output voltage $V_{out}$ is being charged from 0 V to 5 V which is the target voltage i.e. Va as shown in FIG. 8C. In the example, the charging phase of the voltage regulator starts when the output voltage is 0 V.

On the contrary, the discharging phase means the phase when the load of the voltage regulator needs to be discharged to a specific target voltage level from the voltage level which the voltage regulator has produced. The target voltage level is smaller than the previous voltage level. For example, the output voltage $V_{out}$ is being discharged from 5 V (i.e. Va shown in FIG. 8C) to 2.5 V (i.e. Vb shown in FIG. 8C). In this example, the discharging phase of the voltage regulator starts when the output voltage is 5 v.

Referring to FIG. 8A, the charging phase starts when it is needed to charge a word-line or a block selector gate line to a specific voltage higher than the current voltage. When the charging phase starts, the control signal cnt_sig becomes HIGH and after the predetermined amount of the delay, the second switch control signal SW2_EN becomes LOW. In essence, the circuit configuration is the one shown in FIG. 8A, since the first and second switches, SW1 and SW2, are open (off, or non-conductive) and the fourth transistor M4 is rendered conductive in FIG. 6A. Thus SW1 coupled N1 and N2 and SW2 coupled between N2 and N3 are omitted to be shown in FIG. 8A and M4 is simply shown therein as a line connecting from Vpwr to N3. In particular, it should be remarked that the fourth transistor M4 is not in its saturation region, but the voltage difference between its conduction terminals is so little to be negligible. This is due to its sizing and most of all to its biasing with a high overdrive since the gate terminal thereof is grounded and the source terminal is connected to power supply for example 12V.

Figure 5A:
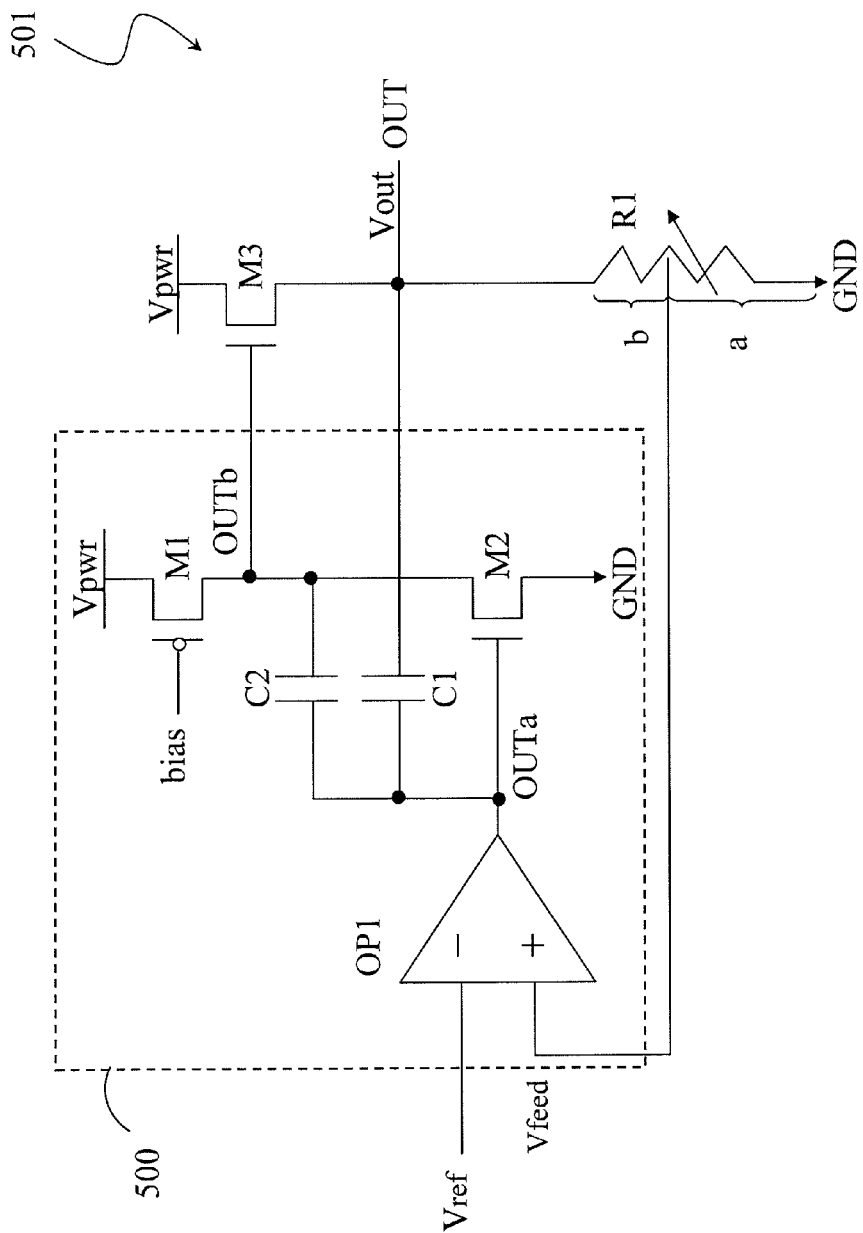
FIG. 5A schematically shows a voltage regulator architecture according to the prior art.
Figure 5B:
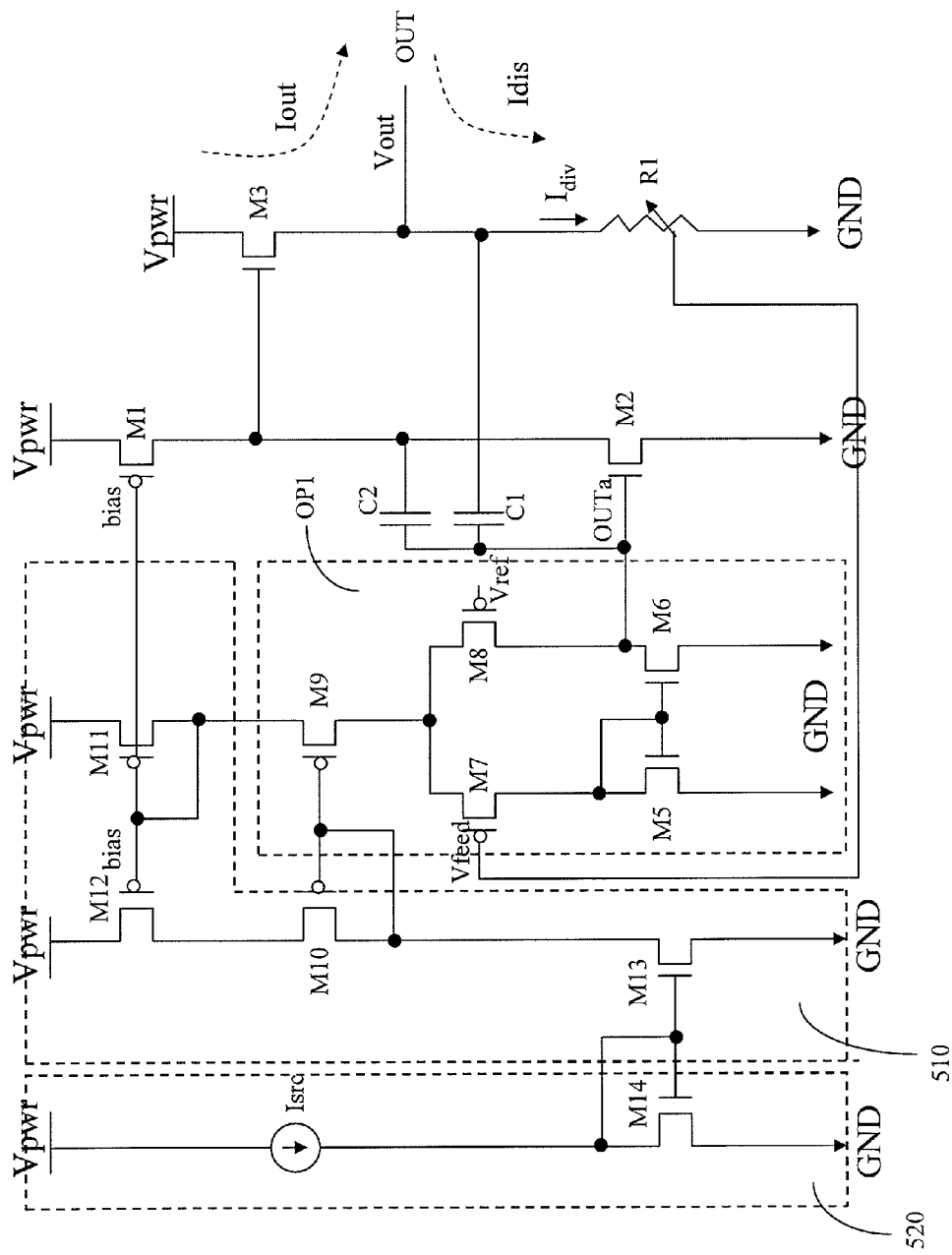
FIG. 5B shows an exemplary circuit structure of the voltage regulator architecture of FIG. 5A.

It is remarked that this circuit configuration shown in FIG. 8A is the same as the one shown in FIG. 5A of the prior art. The circuit has a negative feedback configuration which compares the output voltage divided by a certain ratio with the reference voltage $V_{ref}$. During charge transient the reference voltage Vref is higher than the input voltage Vfeed at the non-inverting input (+), so the output voltage of the first stage amplifier OP1 becomes LOW which, then, is provided to the gate terminal of the second transistor M2. The low value at the output terminal OUTa forces the second transistor M2 being in a cut-off status (or its conductivity is reduced), and currents flowing through the second transistors M2, start decreasing. Then, an output terminal OUTb of the second stage of the voltage regulator starts going up since the current provided by M1 is greater than the one flowing to ground through M2. Since the third transistor M3 has a follower configuration, the output terminal OUTb is provided with the output voltage $V_{out}$ after the threshold voltage plus the overdrive is subtracted. Thus, the negative feedback loop forces the output voltage $V_{out}$ to go up until it reaches a target value determined by the total resistance of the divider R1 and the ratio (a:b) and the reference voltage $V_{ref}$. The third transistor M3 can provide a huge amount of current to the output terminal OUT, thereby performing the charging operation as fast as possible.

Referring to FIG. 8B, the discharging phase starts when it is needed to discharge a word-line or a block selector gate line to a specific voltage level that is lower than the voltage level which has been produced in the charging phase at the word-line or the block selector gate line. When the discharging phase starts, the control signal cnt_sig becomes LOW, and with a predetermined amount of delay, the first switch control signal SW1_EN of the first switch SW1 and the second switch control signal SW2_EN of the second switch SW2 become HIGH. Then, the circuit configuration is the one depicted in FIG. 8B, since the first and second switches, SW1 and SW2 are short-circuited (on or conductive) and the fourth transistor M4 is rendered not conductive. Thus, the line connecting from the N1 to N2 and the line connecting from N2 to N3 is simply shown in FIG. 8B, and the transistor M4 is omitted to be shown therein. The drain and source terminals of the third transistor M3 are coupled via the conductive switch SW2 to each other. Thus the voltage between the drain and source terminals becomes equal to 0 volt and a current flowing through the third transistor M3 is prevented. Thus, the third transistor M3 can be omitted when analyzing the operation of the circuit at this phase.

The voltage regulator has a negative feedback configuration which compares the output voltage divided by a certain ratio with the reference voltage $V_{ref}$. During discharge the reference voltage Vref is—lower than the input voltage Vfeed at the non inverting terminal (+), and the output terminal of the first stage amplifier OP1 becomes HIGH which, then, is provided to the gate terminal of the second transistor M2. The high value at the output terminal OUTa forces the second transistor M2 to conduct, and currents flowing through second transistor M2 start increasing. Then, the voltage value of the output terminal OUTb of the second stage, which is also the output voltage $V_{out}$ at the output terminal of the voltage regulator, starts going down since the current provided by M1 is lower respect to the current flowing to ground through M2. Thus, the negative feedback loop forces the output voltage $V_{out}$ to go down until it reaches a target value determined by the total resistance of the divider R1, the dividing ratio (a:b), and the reference voltage $V_{ref}$. In this configuration, the second transistor M2 can sink a huge amount of current instantly from the external capacitor out of the output terminal, performing the discharge operation as fast as possible.

The discharging of the Vout node can be performed fast and can be also performed faster than that of the prior art, because the additional discharging path from the Vout node via the conductive switch SW1 and the conductive transistor M2 to the ground can be provided in addition to the discharge path from the Vout node via the divider R1 to the ground.

The voltage regulator circuit explained above can enhance the performance of the NAND flash memory, especially during the discharging phase.

The advantage of the voltage regulator according to the embodiment of the invention is that it can operate in a two circuit configuration, one of which is fast for charging load capacitor and the other of which is fast for discharging a load capacitor. Therefore, using this circuit can improve the performance of the NAND memory as a whole.

FIG. 8C schematically shows the exemplary graph for the phases of the voltage regulator according to the embodiment of the invention. Also shown are the control signal cnt_sig and the switch control signals, SW1_EN and SW2_EN.

In phase 1 the voltage regulator has the circuit configuration shown in FIG. 8A. The phase 1 is the charging phase. The output voltage Vout changes from 0 V to Va which is for example 5V. Before phase 1, the output voltage Vout remains 0 volt. The control signal and switch control signals, cnt_sig, sw1_en and sw2_en, are set LOW in phase 1.

At $t_1$, the load capacitor starts to be charged. This phase 1 can be triggered by adjusting the dividing ratio (a:b) of the divider R1, so that the output voltage $V_{out}$ changes from 0 V to a first target voltage $V_a$ by enabling the regulator. Then, during the phase 1, the load capacitor, e.g. word lines, starts to be charged and reaches the first target voltage.

In phase 2, between $t_2$ and $t_3$, the switching of the first and second switches SW1 and SW2, and of the fourth transistor M4 occurs. The control signal cnt_sig is changed from LOW to HIGH, and the switch control signals, sw1_en and sw2_en, are also changed from LOW to HIGH after a delay. According to this control, the circuit configuration is changed from the one shown in FIG. 8A to the one shown in FIG. 8B.

In phase 3, the voltage regulator has the circuit configuration shown in FIG. 8B. During $t_3$ and $t_4$, the output voltage Vout is controlled so as to be constant (i.e. the first target voltage $V_a$, 5 V) by such circuit configuration of the voltage regulator.

At $t_4$, the divider R1 is adjusted to make the output voltage $V_{out}$ have the second target voltage $V_b$. In particular, the output voltage $V_{out}$ keeps being discharged until it reaches the second target voltage $V_b$, for example 2.5 V. The discharging from the first target voltage Va to the second target voltage Vb is performed fast as explained above, because of the two discharge paths, one of which is from the Vout node via the divider R1 to the ground and the other of which is from the Vout node via the conductive SW1 and the conductive transistor M2 to the ground.

After the output voltage has reached the second target voltage $V_b$, the voltage regulator may have the circuit configuration shown in FIG. 8B in order to have the two discharge paths. Also the voltage regulator may have the circuit configuration as shown in FIG. 8A, in order to have only one discharge path from the Vout node via the divider R1 to the ground if the fast discharge of two discharge paths are not needed, and/or in order to be prepared for a coming charging phase. That can be chosen.

Figure 9:
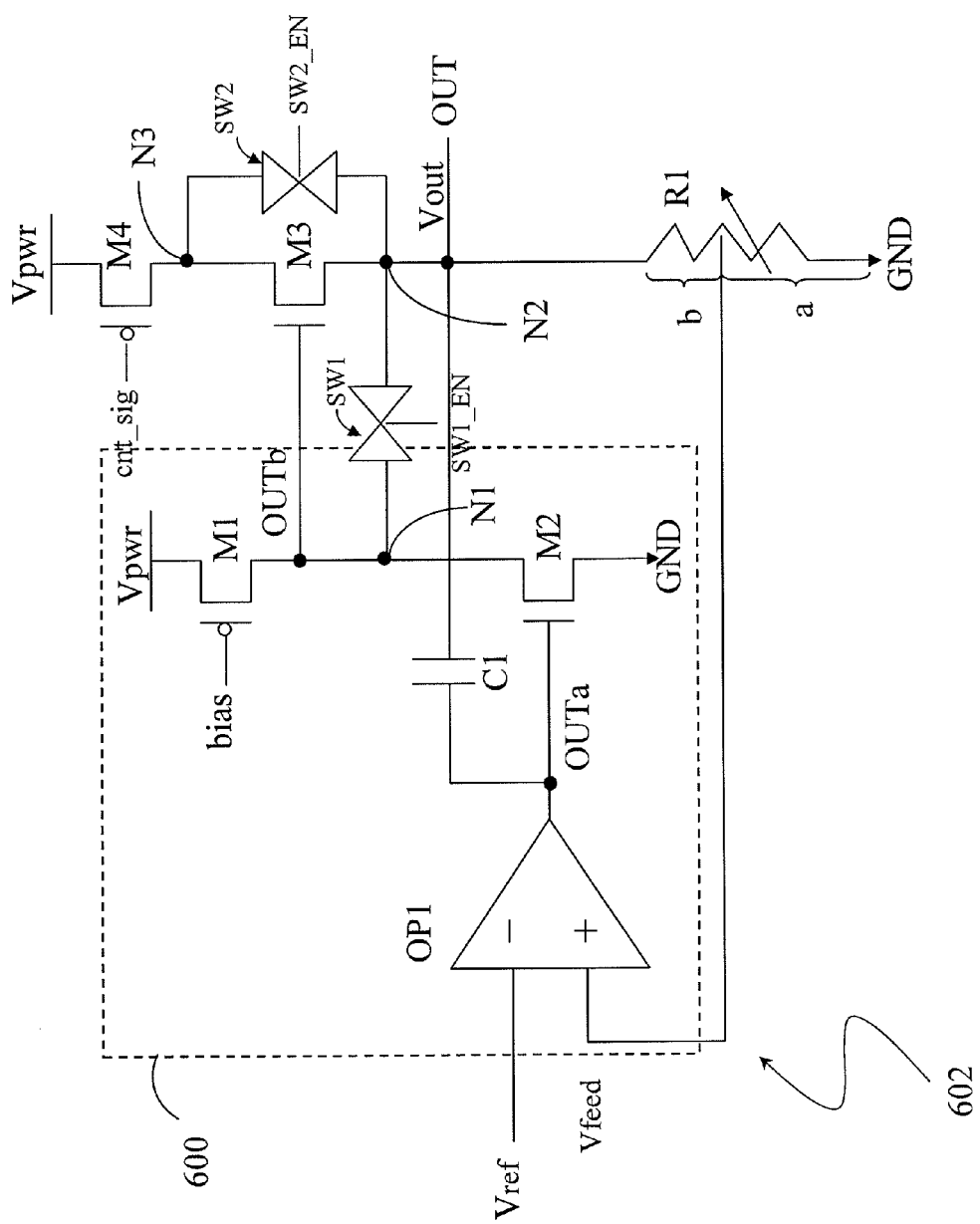
FIG. 9 schematically shows a voltage regulator according to a second embodiment of the invention.

FIG. 9 schematically shows a voltage regulator according to second embodiment of the invention.

The voltage regulator 602 provides a bias voltage to a plurality of row drivers in the NAND memory depicted in FIGS. 2 and 4. The voltage regulator 602 includes a first stage amplifier OP1, a first transistor M1, a second transistor M2, a third transistor M3, a fourth transistor M4, a capacitor C1, a divider R1, a first switch SW1, a second switch SW2. The first stage amplifier OP1 is provided with a reference voltage $V_{ref}$ on its inverting input (−). The gate terminal of the first transistor M1 is provided with a bias voltage. One conduction terminal of the first transistor M1 is connected to a circuit reference voltage Vpwr, while the other conduction terminal of the first transistor M1 is connected to the second transistor M2. The gate terminal of the second transistor M2 is connected to the output terminal OUTa of the first stage amplifier OP1, and one conduction terminal of the second transistor M2 is connected to the ground voltage GND. The capacitor C1 connects the output terminal OUTa to the output terminal of the regulator OUT. The gate terminal of the third transistor M3 is connected to the first internal node N1. One conduction terminal of the third transistor M3 is connected to the output terminal OUT of the voltage regulator 602, while the other conduction terminal of the third transistor M3 is connected to a further internal node N3 which is in turn connected to a conduction terminal of the fourth transistor M4. The output terminal OUT may be connected to an external load, in particular the word-lines or the gate terminal of a block selector.

The fourth transistor M4 is provided with a control signal cnt_sig on its gate terminal, while the other conduction terminals of the fourth transistor M4 are connected to the circuit reference voltage Vpwr and to the further internal node N3, respectively. The divider R1 includes three terminals connected to the non-inverting input (+) of the first stage amplifier OP1, the ground voltage Vpwr and a second internal node N2, respectively. The voltage value at the second internal node N2, i.e. the output voltage $V_{out}$, is divided by the dividing ratio (a:b) of the divider R1 to generate the input voltage Vfeed at the non-inverting input (+) of the first stage amplifier OP1. The dividing ratio (a:b) may be controlled by a control signal (unseen) in a digital manner.

The first switch SW1 has two terminals being coupled with the first internal node N1 and the second internal node N2, respectively. The first switch SW1 is provided with a first switch control signal SW1_EN. The first switch SW1 switches on or off based on the first switch control signal SW1_EN. The second switch SW2 has two terminals being coupled with the second internal node N2 and the further internal node N3, respectively. The second switch SW2 is provided with a second switch control signal SW2_EN. The second switch SW2 switches on or off based on the second switch control signal SW2_EN. The first and second switch control signals are delayed signals starting from the control signal cnt_sig by a certain amount of time.

The first switch SW1, the second switch SW2, and the fourth transistor M4 are controlled by a control signal, which can transform the circuit configuration dynamically. When the control signal cnt_sig is LOW, the first switch control signal SW1_EN and the second switch control signal SW2_EN are LOW unless it is a transitional status since the switch control signals, SW1_EN and SW2_EN, are delayed signals of the control signal cnt_sig. Then, the first switch SW 1 and the second switch SW2 kept OFF, while the fourth transistor M4 kept ON. Thus, when the control signal cnt_sig is LOW, the circuit configuration is similar to the one described with reference to the prior art. If the voltage regulator is supplied by a charge pump, the first switch control signal SW1_EN and the second switch control signal SW2_EN can be furnished by voltage elevators in order to guarantee their functionality in the whole supply voltage range. The third transistor M3 acts as a follower and receives the power supply through the fourth transistor M4.

The circuit structure of the second embodiment is similar to that of the first embodiment except the capacitor C2 is left out. Thus, the operation of the voltage regulator having this circuit structure is substantially the same as the one having the circuit structure of the first embodiment.

Figure 10:
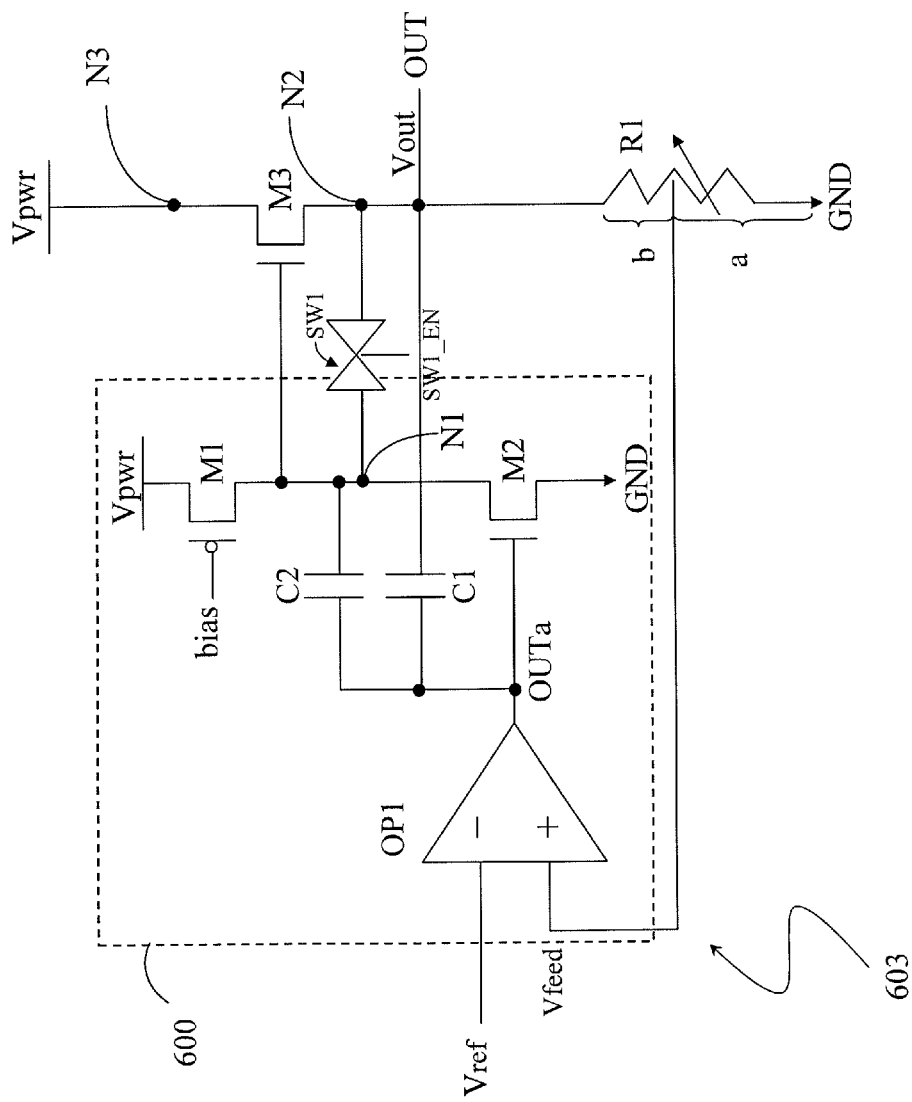
FIG. 10 schematically shows a voltage regulator according to a third embodiment of the invention.

FIG. 10 schematically shows a voltage regulator 603 according to a third embodiment of the invention. Differently from the voltage regulator shown in FIG. 5A, the switch SW 1 is newly provided here in FIG. 10. The switch SW2 and the transistor M4 are not provided in FIG. 10 differently from the first embodiment shown in FIG. 6A.

The voltage regulator 603 provides a bias voltage to a plurality of row drivers in the NAND memory in FIGS. 2 and 4. The voltage regulator 603 includes a first stage amplifier OP1, a first transistor M1, a second transistor M2, a third transistor M3, a capacitor C1, a divider R1, and a switch SW1. The first stage amplifier OP1 is provided with a reference voltage $V_{ref}$ on its inverting input (−). The gate terminal of the first transistor M1 is provided with a bias voltage. One conduction terminal of the first transistor M1 is connected to a circuit reference voltage Vpwr, while the other conduction terminal of the first transistor M1 is connected to the second transistor M2. The gate terminal of the second transistor M2 is connected to the output terminal OUTa of the first stage amplifier OP1, and one conduction terminal of the second transistor M2 is connected to the ground voltage GND. The capacitor C2 connects the output terminal OUTa to a first internal node N1. The gate terminal of the third transistor M3 is connected to the first internal node N1. One conduction terminal of the third transistor M3 is connected to the output terminal OUT, while the other conduction terminal of the third transistor M3 is connected to a further internal node N3 that is supplied with the circuit reference voltage Vpwr. The output terminal OUT may be connected to an external load, in particular the word-lines or the gate terminal of block selector.

The divider R1 includes three terminals connected to the non-inverting input (+) of the first stage amplifier OP1, the ground voltage GND and a second internal node N2, respectively. The voltage value at the second internal node N2, i.e. the output voltage $V_{out}$, is divided by the dividing ratio (a:b) of the divider R1 to generate the voltage signal Vfeed at the non-inverting input (+). The dividing ratio (a:b) may be controlled by a control signal (unseen) in a digital manner.

The switch SW1 has two terminals being coupled with the first internal node N1 and the second internal node N2, respectively. The switch SW1 is provided with a switch control signal SW1_EN. The switch SW1 switches on or off based on the switch control signal SW1_EN.

The switch SW1 is controlled by a control signal, which can transform the circuit configuration dynamically. When the switch control signal SW1_EN is LOW, the switch SW1 is open (off, or non-conductive) and the whole circuit structure of the voltage regulator 603 is similar to the one described with reference to the prior art. The third transistor M3 acts as a follower and provides enough current to the output terminal OUT. When the switch control signal SW1_EN is HIGH, then the switch SW1 gets short (on, or conductive) and the gate and drain terminals of the third transistor M3 are short-circuited one another, thereby no current is provided by the third transistor M3. This circuit configuration is equivalent of the one shown in FIG. 8B. The explanation for the operation of this circuit structure at each phase of its operation is thus omitted here, since it was described in detail previously. In an example, M3 may be a transistor with positive threshold so that when SW1 is 'on' state it is automatically turned off. In an alternative example, a M3 transistor may have low or slightly negative threshold in the configuration 602. In this case, the bump on output voltage which happens when SW1 turns on and C2 is connected to the output can be reduced. With such transistor type, in fact, the node N1 would be nearly at the same voltage of the OUT node when SW1 is 'off' state and M3 acts as a follower. This way, when SW1 is turned on to connect N1 to OUT node, the N1 node voltage does not change abruptly and a capacitive bump on OUTa node is avoided.

Advantageously, a voltage regulator for providing bias voltage to a NAND memory device according to the described embodiments uses switch(es) and capacitor(s) to have a different circuit configuration for each of the charging and discharging phases. A two configuration circuit can maximize the performance of the voltage driver when more than two target voltages are required.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed:

1. A device comprising:
an amplifier including a first input terminal supplied with a reference voltage, a second input terminal supplied with a feed back voltage, and an output terminal;
first and second power supply lines, the first power supply being higher than the second power supply line;
an internal node;
a first transistor including a source-drain path coupled between the first power supply line and the internal node and including a gate terminal supplied with a bias voltage;
a second transistor including a source-drain path coupled between the internal node and the second power supply line and including a gate terminal coupled to the output terminal of the amplifier;
an output node;
a third transistor including a source-drain path coupled between the first power supply line and the output node and including a gate terminal coupled to the internal node;
a divider coupled between the output node and the second power supply line and configured to produce a first discharge path from the output node to the second power supply line to establish the feed back voltage; and
a first switch circuit supplied with a first signal and coupled between the output node and the internal node.

2. The device according to claim 1, wherein the first switch circuit includes:
a first switch transistor coupled between the output node and the internal node and including a gate terminal supplied with an inverted one of the first signal; and
a second switch transistor coupled between the output node and the internal node and including a gate terminal supplied with the first signal, the first and second switch transistors being different in a channel type from each other.

3. The device according to claim 1, further comprising:
a second switch circuit supplied with a second signal and coupled in parallel to the third transistor, and
a fourth transistor inserted between the first power supply line and the third transistor and including a gate terminal supplied with a control signal.

4. The device according to claim 3, wherein the second switch circuit includes:
a third switch transistor coupled in parallel to the third transistor and including a gate terminal supplied with an inverted one of the second signal; and
a fourth switch transistor coupled in parallel to the third transistor and including a gate terminal supplied with the second signal, the third and fourth switch transistors being different in a channel type from each other.

5. The device according to claim 3, further comprising:
a controller supplying the control signal; and
a delay circuit delaying the control signal to produce the first and second signals.

6. The device according to claim 3, further comprising:
a first capacitor having one end coupled to the output terminal of the amplifier and the other end coupled to the output node.

7. The device according to claim 6, further comprising:
a second capacitor having one end coupled to the output terminal of the amplifier and the other end coupled to the internal node.

8. The voltage regulator according to claim 5, wherein the delay circuit including:
a plurality of inverters each of which is coupled in series, an input terminal of the delay circuit being provided with the control signal, and an output terminal of the delay circuit providing the first signal.

9. The device according to claim 1, further comprising:
a first capacitor having one end coupled to the output terminal of the amplifier and the other end coupled to the output node; and
a second capacitor having one end coupled to the output terminal of the amplifier and the other end coupled to the internal node.

10. The device according to claim 1, further comprising:
a current mirror circuit providing the gate terminal of the first transistor with the bias voltage.

11. The device according to claim 1, wherein the amplifier comprising:
a fifth transistor including a first terminal coupled to the second power supply line, and a second terminal and a gate terminal being coupled to each other;
a sixth transistor including a gate terminal coupled to the gate terminal of the fifth transistor, a first terminal being coupled to the second power supply line, and a second terminal being, as the output terminal of the amplifier included therein, coupled to the gate terminal of the second transistor;
a seventh transistor including a gate terminal being, as the second input terminal of the amplifier included therein, coupled to the divider circuit to receive the first voltage, a first terminal being coupled to the second terminal of the fifth transistor, and a second terminal;
an eighth transistor including a gate terminal being, as the first input terminal of the first amplifier included therein, supplied with the reference voltage, a first terminal being coupled to the second terminal of the sixth transistor, and a second terminal being coupled to the second terminal of the seventh transistor; and
a ninth transistor including a first terminal being coupled in common to the second terminals of the seventh transistor and the eighth transistor, a gate terminal and a second terminal coupled to a current mirror circuit.

12. The voltage regulator according to claim 11, wherein the current mirror comprising:
a tenth transistor including a gate terminal coupled to the gate terminal of the ninth transistor, a first terminal, and a second terminal;
an eleventh transistor including a gate terminal and a first terminal coupled to each other, and a second terminal coupled to the first power supply line;
a twelfth transistor including a gate terminal coupled in common to the gate terminal of the eleventh transistor and the gate terminal of the first transistor to provide the bias voltage, a first terminal coupled to the second terminal of the tenth transistor, and a second terminal coupled to the first power supply line;
a thirteenth transistor including a first terminal coupled to the second power supply line, a second terminal coupled to the first terminal of the tenth transistor, and a gate terminal;
a fourteenth transistor including a first terminal coupled to the second power supply line, a second terminal coupled to the second power supply line, a gate terminal coupled to the gate terminal of the thirteenth transistor, the second terminal and the gate terminal of the fourteenth transistor being coupled to each other; and a constant current source including a first terminal coupled to the second terminal of the fourteenth transistor to provide the second terminal of the fourteenth transistor with a current, and a second terminal coupled to the first power supply line.

13. A device comprising:
a data line;
a regulation circuit configured to receive a reference voltage and a feed back signal which is fed back from the data line, and output a first signal;
a transistor configured to receive the first signal, the transistor being deactivated when receiving a first logic level of the first signal in order to apply a first power supply voltage on a first power supply line to the data line, and the transistor being activated when a second logic level of the first signal in order to stop applying the first power supply voltage to the data line; and
a discharge circuit provided between the transistor and the data line to produce a discharge path between the transistor and the data line when the transistor is activated, in order to discharge a charge on the data line via the activated transistor to a second power supply line supplied with a second power supply voltage different from the first power supply voltage.

14. The device according to claim 13, further comprising:
a circuit inserted between the data line and the regulation circuit and producing the feed back signal.

15. The device according to claim 14, wherein the circuit produces another discharge path, different from the discharge path of the discharge circuit, in order to discharge a charge on the data line.

16. The device according to claim 15, further comprises:
a controller controlling a switch transistor of the discharge circuit such that the switch transistor is rendered conductive in order to discharge the charge on the data line.

17. The device according to claim 13, further comprising:
a circuit coupled to the data line and applying, when activated, the first power supply voltage on the first power supply line to the data line.

18. The device according to claim 13, further comprising:
a flash memory array including a cell coupled to the data line.

19. A method comprising:
providing a device which comprises a flash memory cell coupled to a data line, a voltage regulator coupled to the data line, the voltage regulator including a first switch circuit coupled to the data line;
providing the voltage regulator of the device with a first discharge path to discharge the data line;
rendering the first switch circuit conductive; and
providing a second discharge path to discharge the data line via the conducted first switch circuit when the first discharge path is provided, the first and second discharge paths being different from each other.

20. The method according to the claim 19, further comprising:
charging the data line, before rendering the first switch circuit conductive and providing the second discharge path.

* * * * *